United States Patent
Hu et al.

(10) Patent No.: US 9,741,569 B2
(45) Date of Patent: Aug. 22, 2017

(54) FORMING MEMORY USING DOPED OXIDE

(71) Applicant: Macronix International Co., Ltd., Hsinchu (TW)

(72) Inventors: Chih-Wei Hu, Toufen Township (TW); Teng-Hao Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/571,540

(22) Filed: Dec. 16, 2014

(65) Prior Publication Data

US 2016/0172369 A1    Jun. 16, 2016

(51) Int. Cl.
| | |
|---|---|
| H01L 21/22 | (2006.01) |
| H01L 21/38 | (2006.01) |
| H01L 21/225 | (2006.01) |
| H01L 27/11578 | (2017.01) |

(52) U.S. Cl.
CPC ...... *H01L 21/2256* (2013.01); *H01L 21/2255* (2013.01); *H01L 27/11578* (2013.01)

(58) Field of Classification Search
CPC ............. H01L 27/11578; H01L 21/225; H01L 21/2255; H01L 27/1128; H01L 27/11551
See application file for complete search history.

(56) References Cited

U.S. PATENT DOCUMENTS

| | | | |
|---|---|---|---|
| 6,906,940 B1 | 6/2005 | Lue | |
| 7,315,474 B2 | 1/2008 | Lue | |
| 7,420,242 B2 | 9/2008 | Lung | |
| 7,696,559 B2 | 4/2010 | Arai et al. | |
| 7,851,849 B2 | 12/2010 | Kiyotoshi | |
| 8,363,476 B2 | 1/2013 | Lue et al. | |
| 8,467,219 B2 | 6/2013 | Lue | |
| 8,503,213 B2 | 8/2013 | Chen et al. | |
| 8,759,895 B2 * | 6/2014 | Tang | H01L 27/11524 257/314 |

(Continued)

FOREIGN PATENT DOCUMENTS

EP    2048709 A2    4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Meiya Li
*Assistant Examiner* — Peter M Albrecht
(74) *Attorney, Agent, or Firm* — Yiding Wu; Haynes Beffel & Wolfeld LLP

(57) ABSTRACT

A method is provided for manufacturing a memory device. A strip of semiconductor material is formed having a memory region, a contact landing area region and a switch region between the memory region and the contact landing area region. A memory layer is formed on surfaces of the strip in the memory region. A plurality of memory cell gates is formed over the memory region of the strip. A switch gate is formed over the switch region of the strip. A doped insulating material is deposited over a portion of the strip between the contact landing area region and the memory region. Diffusion of dopant is caused from the doped insulating material into the strip in the portion of the strip.

19 Claims, 22 Drawing Sheets

(56) References Cited

U.S. PATENT DOCUMENTS

| | | |
|---|---|---|
| 8,759,899 B1 | 6/2014 | Lue et al. |
| 2005/0280061 A1 | 12/2005 | Lee |
| 2007/0045708 A1 | 3/2007 | Lung |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2011/0169067 A1* | 7/2011 | Ernst .................. H01L 21/8221 257/316 |
| 2012/0119283 A1 | 5/2012 | Lee et al. |
| 2012/0182806 A1* | 7/2012 | Chen .................. H01L 27/11573 365/185.17 |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM, Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," 2007 Symp. VLSI Tech., Digest of Tech. Papers, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

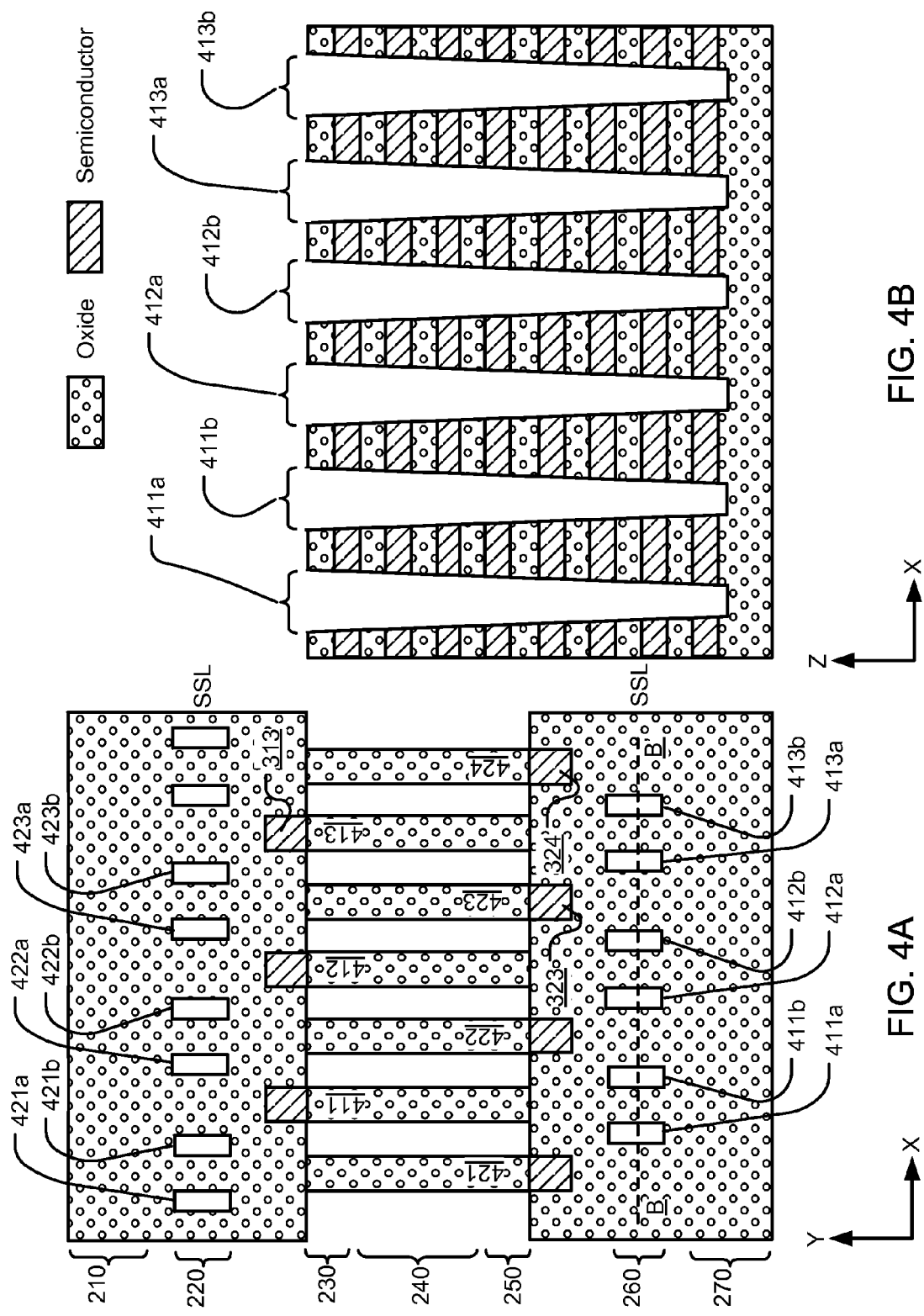

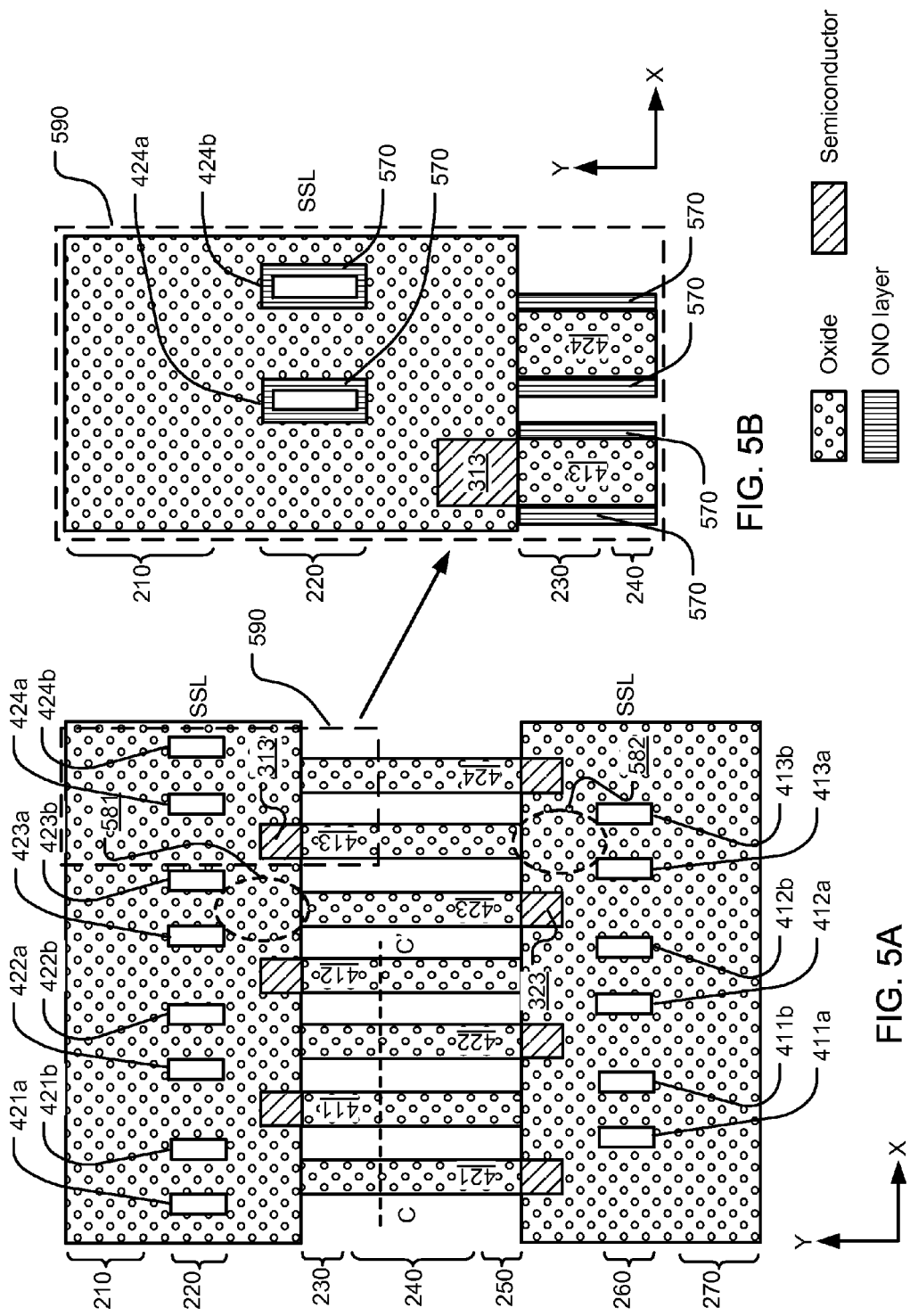

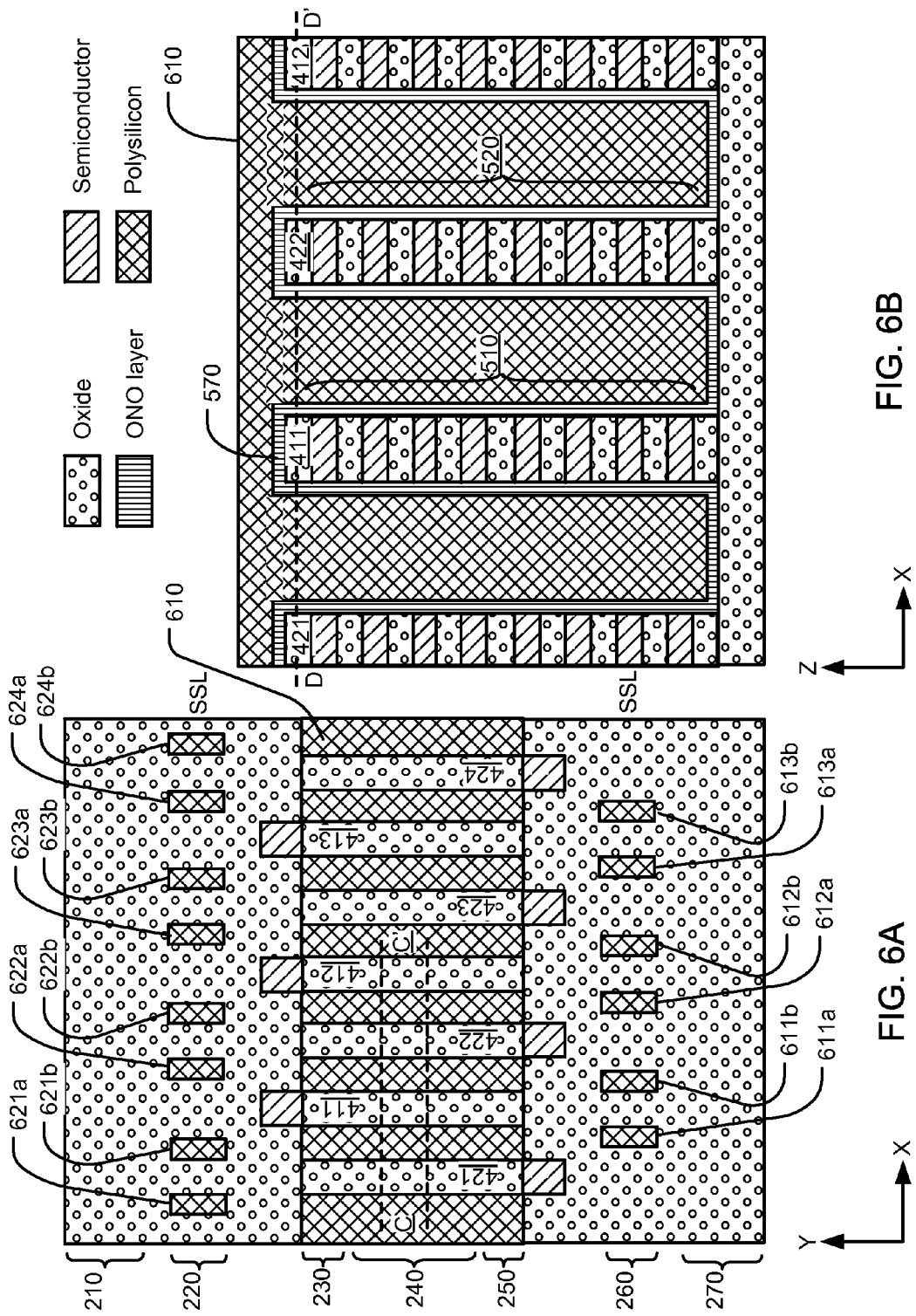

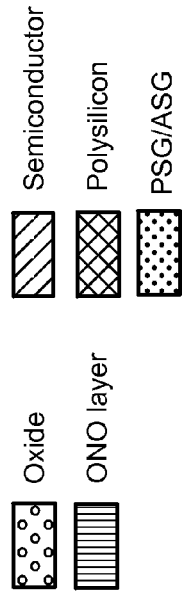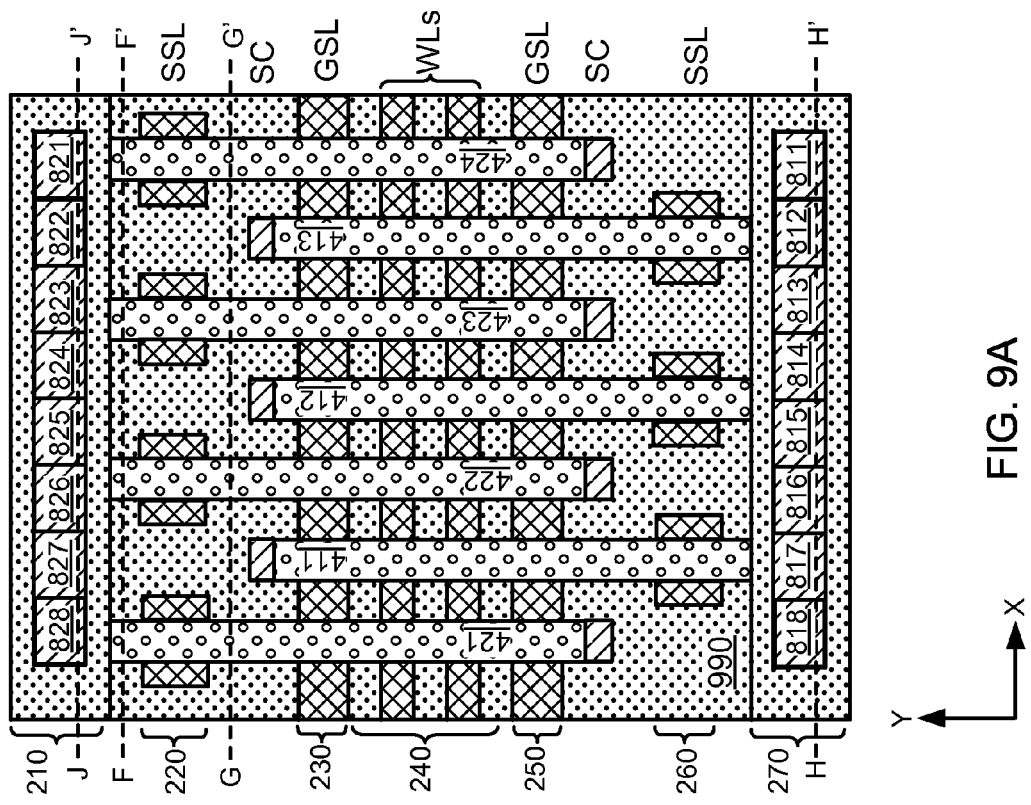
FIG. 9A

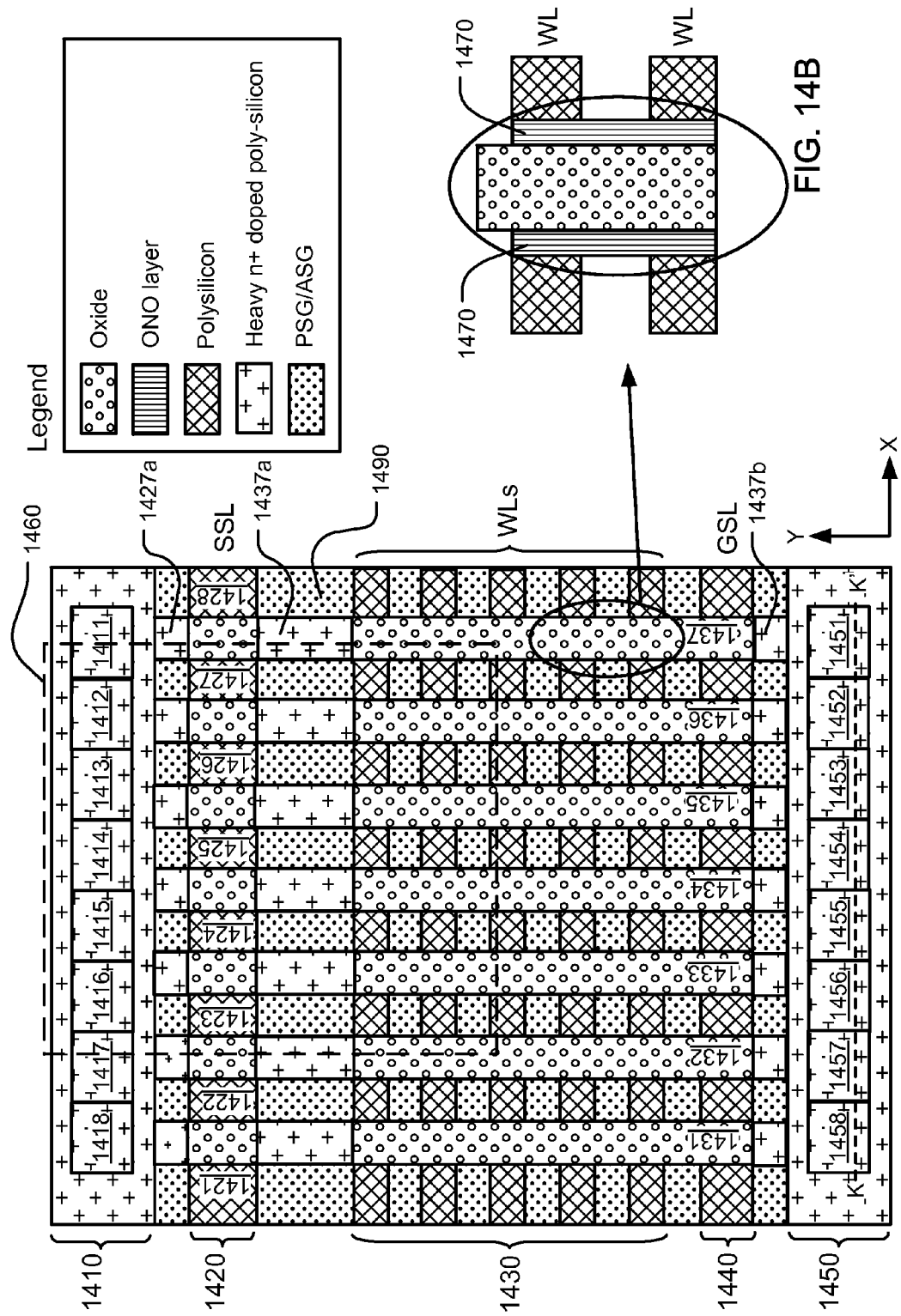

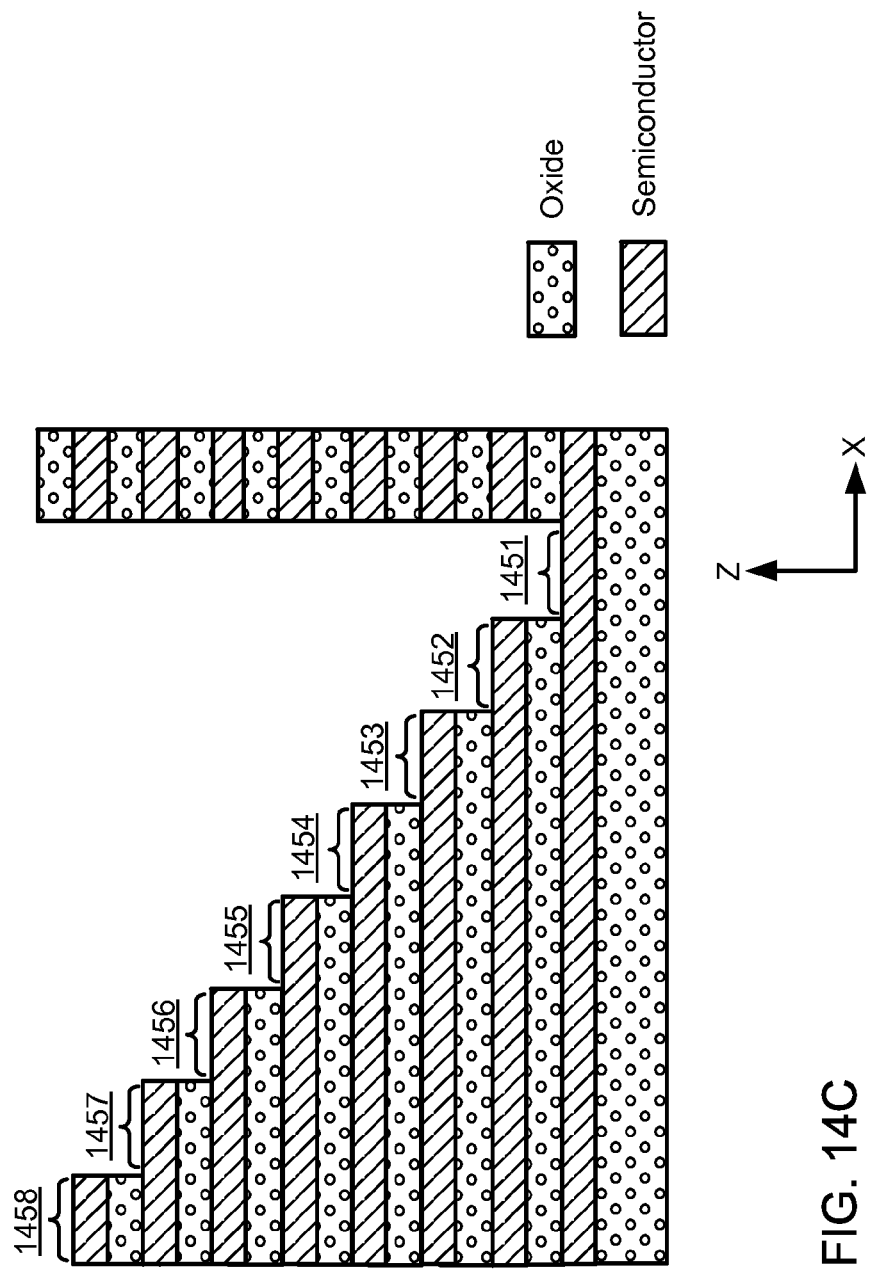

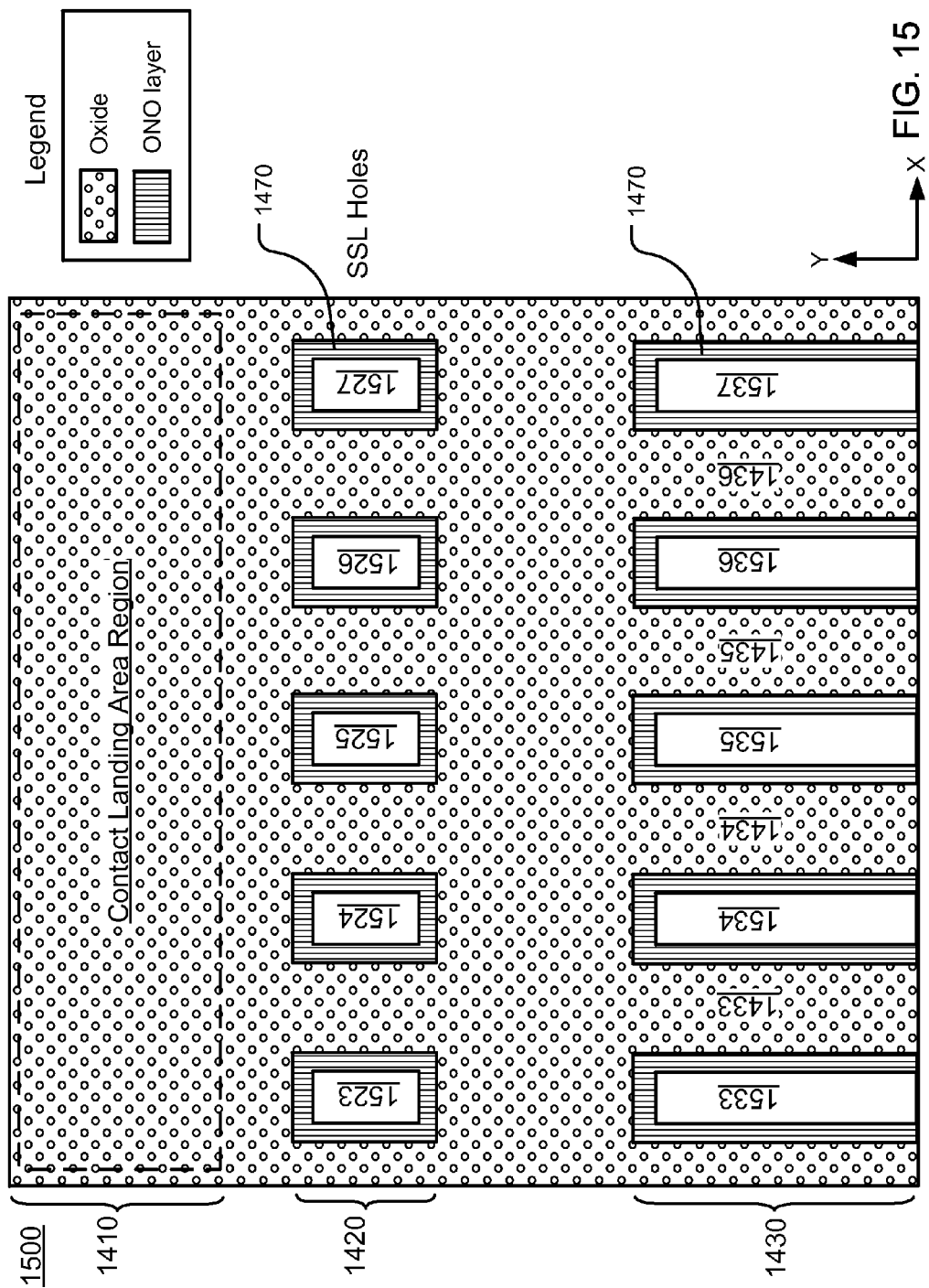

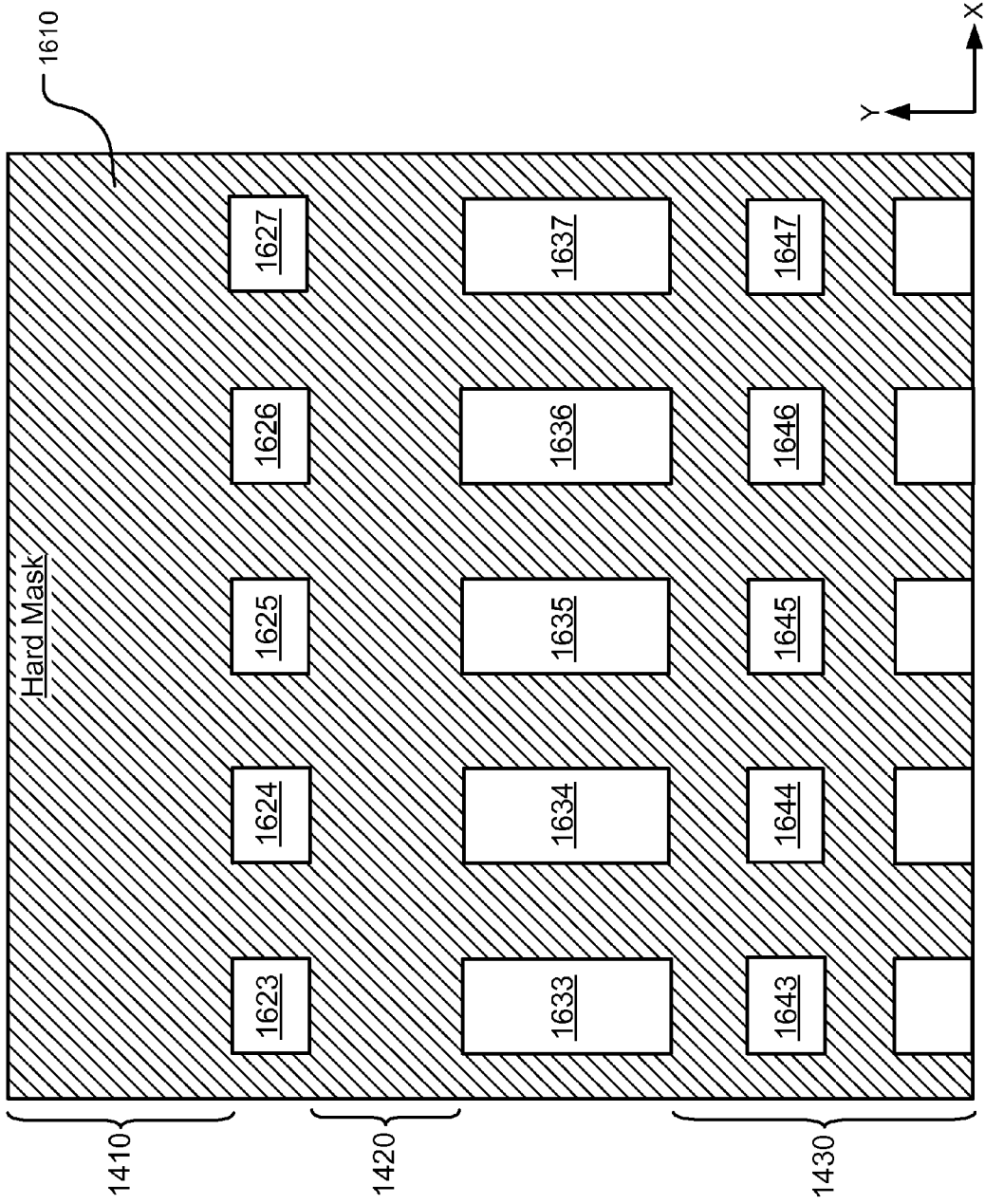

FORMING MEMORY USING DOPED OXIDE

BACKGROUND

Field of the Disclosure

The present disclosure relates to three-dimensional (3D) memory devices, and more particularly to methods to fabricate such memory devices.

Description of Related Art

Three dimensional (3D) semiconductor devices are characterized by multiple layers forming a stack of alternating active layers and insulating layers. In a memory device, each of the layers can include a planar array of memory cells. For certain three-dimensionally stacked memory devices, active layers can comprise active strips of materials configured as bit lines or word lines for memory cells stacked in spaced-apart ridge-like structures. The active layers can be made from a conductor, an undoped semiconductor, or a doped (p-type or n-type) semiconductor. In such 3D memory, memory cells can be disposed at the cross-points of the stacked bit lines or word lines and the crossing word lines or bit lines, forming a 3D memory array.

Active layers can be formed of semiconductor material and then etched to form active strips. The pattern of doping in the active strips can be a critical factor affecting the performance of memory cells including the active strips. For example, the current through a NAND string in a 3D NAND structure is limited by the doping in portions of the active strips between string select structures (SSLs) and bit line pad regions, and between memory cells and a ground select line (GSL).

It is desirable to provide a method for improving control of doping concentration in the active strips, including in portions of the active strips between SSLs and bit line pad regions, between SSLs and GSL, and in other parts of the active strips.

SUMMARY

The present technology provides a method for manufacturing a memory device. A strip of semiconductor material is formed having a memory region, a contact landing area region and a switch region between the memory region and the contact landing area region. A memory layer is formed on surfaces of the strip in the memory region. A plurality of memory cell gates is formed over the memory region of the strip. A switch gate is formed over the switch region of the strip. A doped insulating material is deposited over a portion of the strip between the contact landing area region and the memory region. Diffusion of dopant is caused from the doped insulating material into the strip in the portion of the strip, for example by a drive-in process that can enhance the dosage of the dopant in the strip by an extra thermal annealing. The doped insulating material can include PSG (phosphosilicate glass film) or ASG (arsenosilicate glass film) for forming n+ junction or BSG (borosilicate glass film) for forming p+ junction.

The memory device can include a conductor (e.g. source contact) in contact with the strip at an end of the strip opposite the contact landing area region, and an end region between said conductor and the memory region of the strip. The doped insulating material can be deposited over the end region.

The memory device can include a second contact landing area region in the strip at an end opposite the first mentioned contact landing area region, a conductor in contact with the strip at an end of the strip opposite the second contact landing area region, and an end region between said conductor and the memory region of the strip. The doped insulating material can be deposited over the end region.

The memory cell gates block diffusion of the dopant from the doped insulating material into portions of the memory region of the strip. The doped insulating material can be deposited over the contact landing area region of the strip, and diffusion of dopant can be caused from the doped insulating material into the contact landing area region. The method can be applied to a plurality of stacks of such strips of semiconductor material.

A memory device manufactured using the method substantially as described herein is also provided.

The present technology can be seen on review of the drawings, the detailed description and the claims, which follow.

BRIEF DESCRIPTION OF THE DRAWINGS

FIGS. 14A, 14B and 14C show an alternative 3D structure using a doped insulating material as doping source.

FIGS. 15, 16, 17, 18 and 19 illustrate stages in a basic process flow for manufacturing a memory device like that of FIGS. 14A, 14B and 14C, using a doped insulating material as doping source.

DETAILED DESCRIPTION

Figure 1:
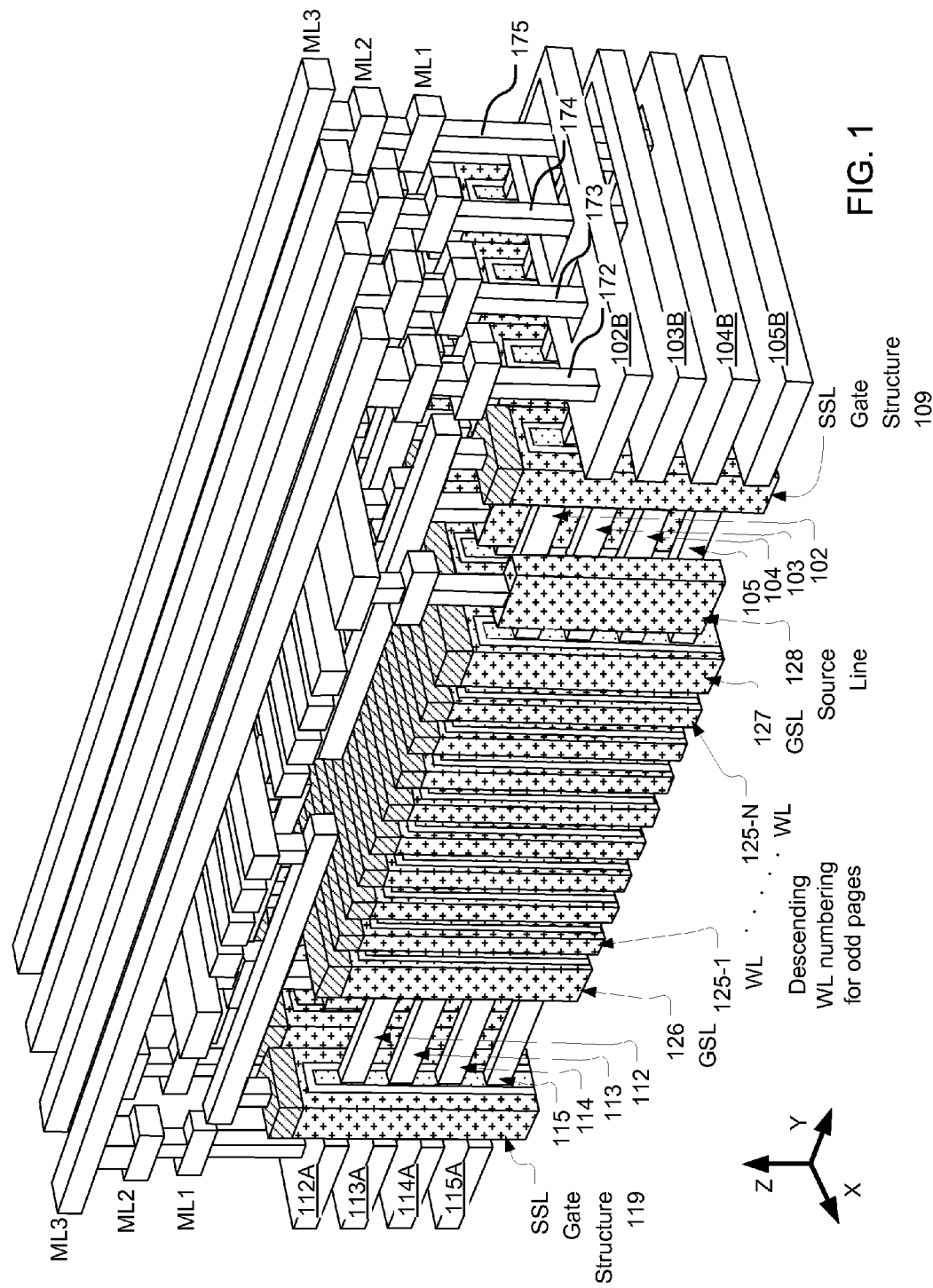
FIG. 1 is a perspective illustration of a three-dimensional (3D) NAND-flash memory device.

A detailed description of embodiments of the present technology is provided with reference to the Figures. It is to be understood that there is no intention to limit the present technology to the specifically disclosed structural embodiments and methods but that the present technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a perspective illustration of a three-dimensional (3D) NAND-flash memory device. The device illustrated in FIG. 1 includes stacks of conductive strips separated by insulating material. Insulating material is removed from the drawing to expose additional structure. For example, insulating material is removed between the conductive strips in the stacks, and is removed between the stacks of conductive strips. This structure is described herein in some detail, as an example of a three-dimensional (3D) memory array which can be manufactured on a semiconductor substrate, in combination with peripheral circuits on the substrate (not shown). Other multilayer circuit structures can also be formed using the technology described herein.

In the example shown in FIG. 1, a multilayer array is formed on an insulating layer, and includes a plurality of word lines 125-1 WL through 125-N WL conformal with the plurality of stacks. The plurality of stacks includes conductive strips 112, 113, 114, and 115 in multiple planes. Conductive strips in the same plane are electrically coupled together by linking elements (e.g. 102B).

Linking elements 112A, 113A, 114A, and 115A terminate conductive strips, such as the conductive strips 112, 113, 114, and 115 in the plurality of stacks. As illustrated, these linking elements 112A, 113A, 114A, and 115A are electrically connected to different bit lines for connection to decoding circuitry to select planes within the array. These linking elements 112A, 113A, 114A, and 115A can be patterned at the same time that the plurality of stacks is defined.

Linking elements 102B, 103B, 104B, and 105B terminate conductive strips, such as conductive strips 102, 103, 104, and 105. As illustrated, interlayer connectors 172, 173, 174, 175 electrically connect linking elements 102B, 103B, 104B, and 105B to different bit lines in metal layers, such as a metal layer ML3, for connection to decoding circuitry to select planes within the array. These linking elements 102B, 103B, 104B, and 105B can be patterned at the same time that the plurality of stacks is defined.

Any given stack of conductive strips is coupled to either the linking elements 112A, 113A, 114A, and 115A, or the linking elements 102B, 103B, 104B, and 105B, but not both. A stack of semiconductor bit lines has one of the two opposite orientations of bit line end-to-source line end orientation, or source line end-to-bit line end orientation. For example, the stack of conductive strips 112, 113, 114, and 115 has bit line end-to-source line end orientation; and the stack of conductive strips 102, 103, 104, and 105 has source line end-to-bit line end orientation.

The stack of conductive strips 112, 113, 114, and 115 is terminated at one end by the linking elements 112A, 113A, 114A, and 115A, passes through SSL gate structure 119, ground select line GSL 126, word lines 125-1 WL through 125-N WL, ground select line GSL 127, and is terminated at the other end by source line 128. The stack of conductive strips 112, 113, 114, and 115 does not reach the linking elements 102B, 103B, 104B, and 105B.

The stack of conductive strips 102, 103, 104, and 105 is terminated at one end by the linking elements 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of conductive strips 102, 103, 104, and 105 does not reach the linking elements 112A, 113A, 114A, and 115A.

A layer of memory material is disposed in interface regions at cross-points between surfaces of the conductive strips 112-115 and 102-105 and the plurality of word lines 125-1 WL through 125-N WL. Ground select lines GSL 126 and GSL 127 are conformal with the plurality of stacks, similar to the word lines.

Every stack of conductive strips is terminated at one end by linking elements and at the other end by a source line. For example, the stack of conductive strips 112, 113, 114, and 115 is terminated at one end by linking elements 112A, 113A, 114A, and 115A, and terminated on the other end by a source line 128. At the near end of the figure, every other stack of conductive strips is terminated by the linking elements 102B, 103B, 104B, and 105B, and every other stack of conductive strips is terminated by a separate source line. At the far end of the figure, every other stack of conductive strips is terminated by the linking elements 112A, 113A, 114A, and 115A, and every other stack of conductive strips is terminated by a separate source line.

Bit lines and string select lines are formed at the metals layers ML1, ML2, and ML3. Bit lines are coupled to a plane decoder (not shown). String select lines are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

In the example shown in FIG. 1, memory elements are formed in interface regions at cross-points between surfaces of the conductive strips 112-115 and 102-105 and the plurality of word lines 125-1 WL through 125-N WL. In operation, when voltage is applied to a gate structure of a memory element via one of the word lines, a channel region in a memory cell corresponding to the memory element beneath the gate structure is turned on.

Figures 2A, 2B:
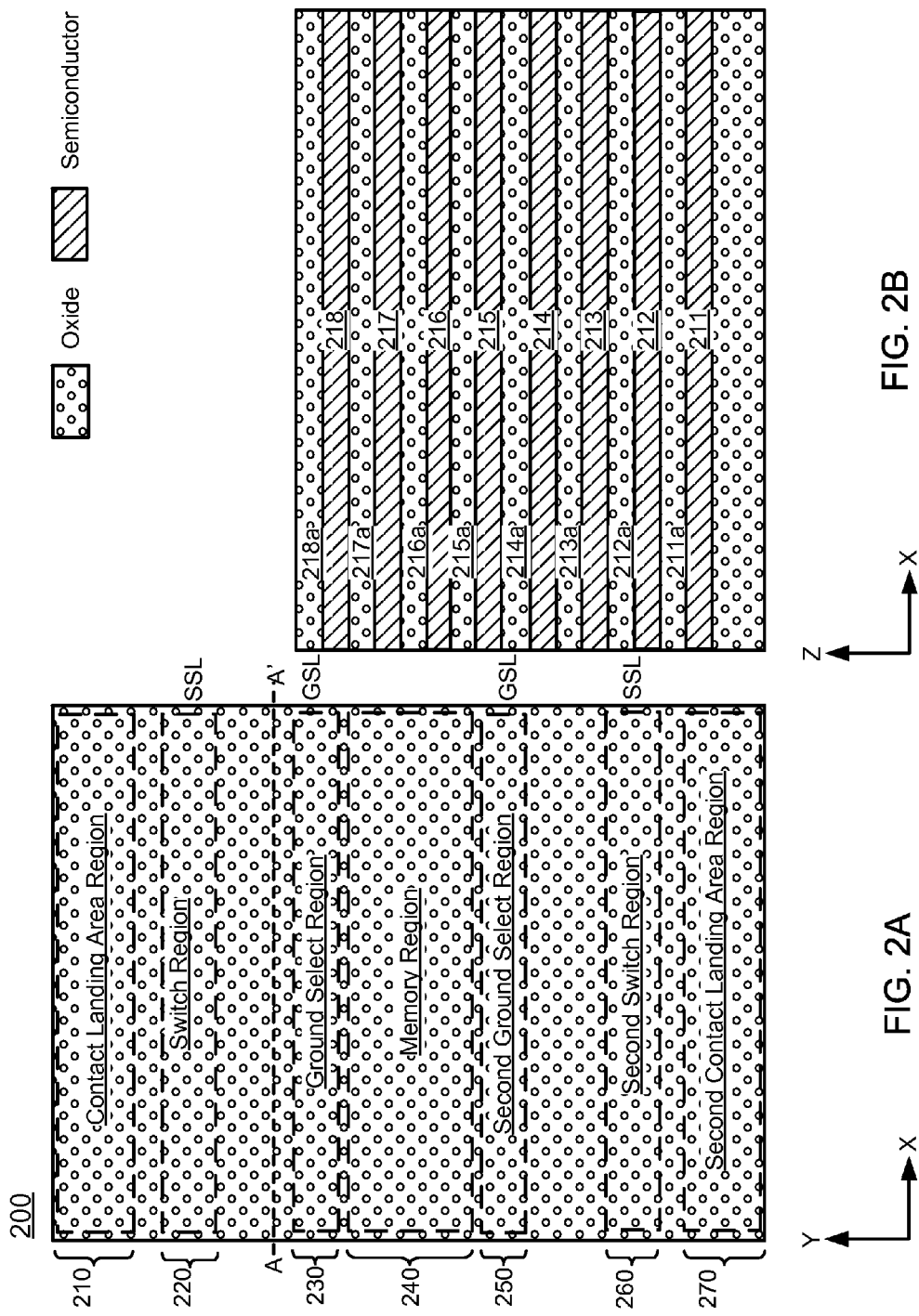
FIGS. 2A/2B, 3A/3B, 4A/4B, 5A/5B/5C, 6A/6B, 7A/7B, 8A/8B, 9A/9B, 10A/10B, 11 and 12 illustrate stages in a basic process flow for manufacturing a memory device like that of FIG. 1, using a doped insulating material as doping source.

FIGS. 2A/2B, 3A/3B, 4A/4B, 5A/5B/5C, 6A/6B, 7A/7B, 8A/8B, 9A/9B, 10A/10B, 11 and 12 illustrate stages in a basic process flow for manufacturing a memory device like that of FIG. 1. The basic process flow forms a plurality of stacks of strips of semiconductor material having a memory region, a contact landing area region (BL pad) and a switch region (SSL region) between the memory region and the contact landing area region. The plurality of stacks of strips of semiconductor material also has a ground select region (GSL region) between the switch region and the memory region, and a second ground select region between a second switch region and the memory region.

FIG. 2A shows a top view of a structure 200, including example locations of the contact landing area region (e.g. 210), the switch region (e.g. 220), the ground select region (e.g. 230), the memory region (e.g. 240), the second ground select region (e.g. 250), the second switch region (e.g. 260), and a second contact landing area region (e.g. 270). Those regions are further described herein.

FIG. 2B is a cross-sectional view of the structure taken along A-A' in FIG. 2A. FIG. 2B shows a plurality of layers of semiconductor material (e.g. 211-218) separated by insulating material (e.g. 211a-218a) on an integrated circuit substrate (not shown), resulting from alternating deposition of the layers of semiconductor material and the insulating material. In one implementation, the layers of semiconductor material can be formed using un-doped poly-silicon in a blanket deposition in an array area of a memory device. The insulating material can be implemented for example using silicon dioxide, other silicon oxides, or silicon nitride. These layers can be formed in a variety of ways, including low pressure chemical vapor deposition LPCVD processes available in the art.

Figures 3A, 3B:
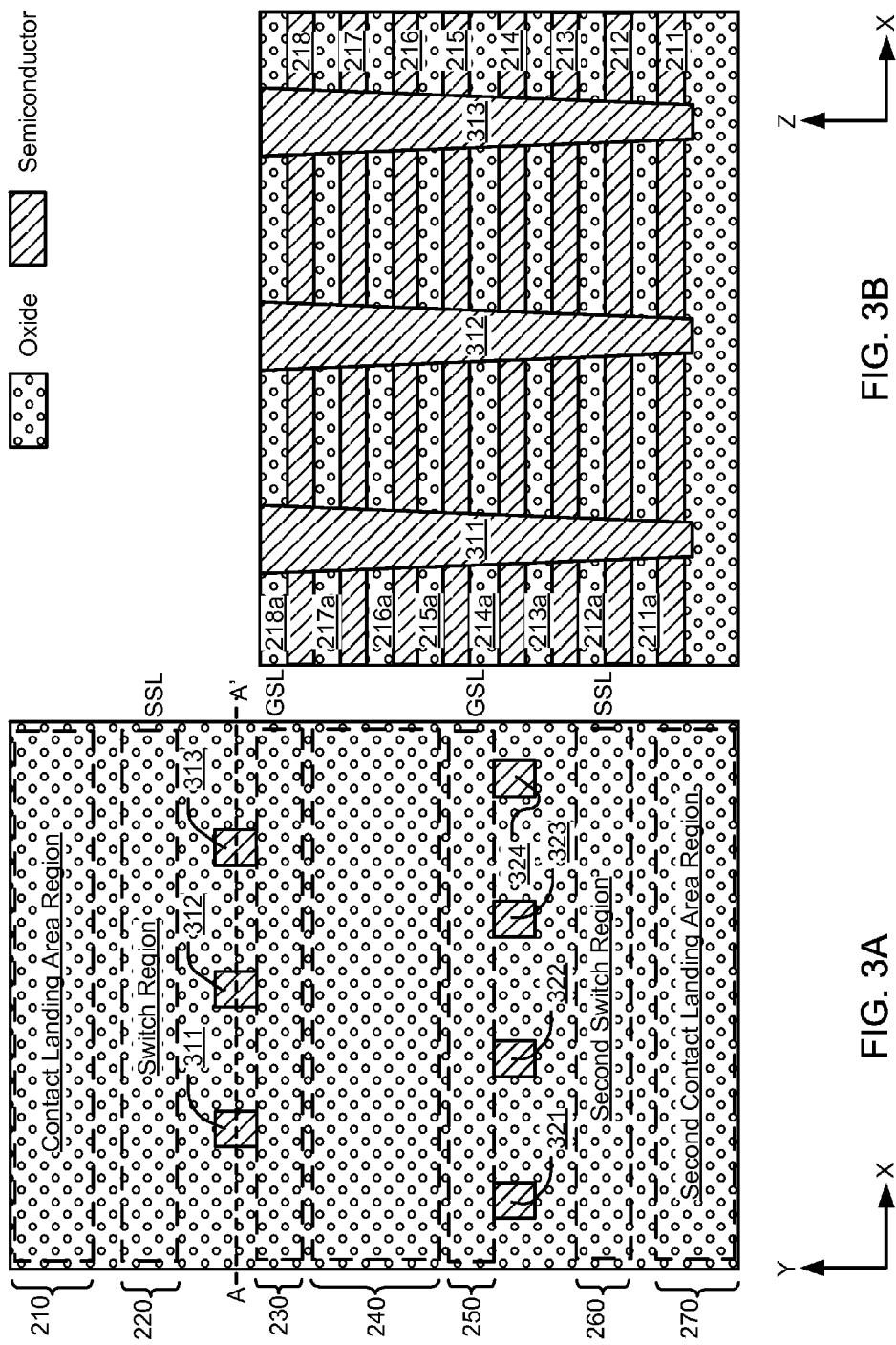

In FIGS. 3A/3B, a plurality of pillars of conductive material (e.g. 311-313, 321-324), such as a conductor or a doped semiconductor, is formed, extending through and connecting the plurality of layers of semiconductor material (e.g. 211-218), for example between the ground selection region 230 and the switch region 220, and between the second ground selection region 250 and the second switch region 260. FIG. 3A shows a top view of the structure, while FIG. 3B shows a cross-sectional view of the structure taken along A-A' in FIG. 3A. The plurality of pillars can be used as source contact plugs of NAND strings (e.g. 128, FIG. 1). A row of pillars (e.g. 321-324) can act as source contact conductors (SC) and be in contact with strips of semiconductor material at an end of the strips opposite the contact landing area region 210, while a second row of pillars (e.g. 311-313) can act as source contact conductors (SC) and be in contact with strips of semiconductor material at an end of the strips opposite the second contact landing area region 270. Strips of semiconductor material are shown in FIGS. 4A and 4B. In one implementation, the pillars can be implemented with the same material as the layers of semiconductor material (e.g. 211-218).

FIGS. 4A/4B show results of etching the plurality of layers of semiconductor material (e.g. 211-218, FIG. 2) to define a plurality of stacks of strips (e.g. 411-413, 421-424) in the ground selection region 230, the memory region 240 and the second ground selection region 250 that terminate with the plurality of pillars (e.g. 311-313, 321-324, FIGS. 3A/3B). FIG. 4A shows a top view of the structure 200, while FIG. 4B shows a cross-sectional view of the structure taken along B-B' in FIG. 4A. The plurality of stacks of strips can be used to form conductive strips in multiple planes in the structure (e.g. 112-115, 102-105, FIG. 1).

FIGS. 4A/4B also show results of forming a plurality of holes (e.g. 421a-424a, 421b-424b, 411a-413a, 411b-413b) through the plurality of layers of semiconductor material (e.g. 211-218) in the switch region 220 between the memory region 240 and the contact landing area region 210, and in the second switch region 260 between the memory region 240 and the second contact landing area region 270. The plurality of holes can be patterned at the same time that the plurality of stacks of strips (e.g. 411-413, 421-424) is defined. The plurality of holes can be used to form SSL gate structures (e.g. 109 and 119, FIG. 1).

Figure 5C:
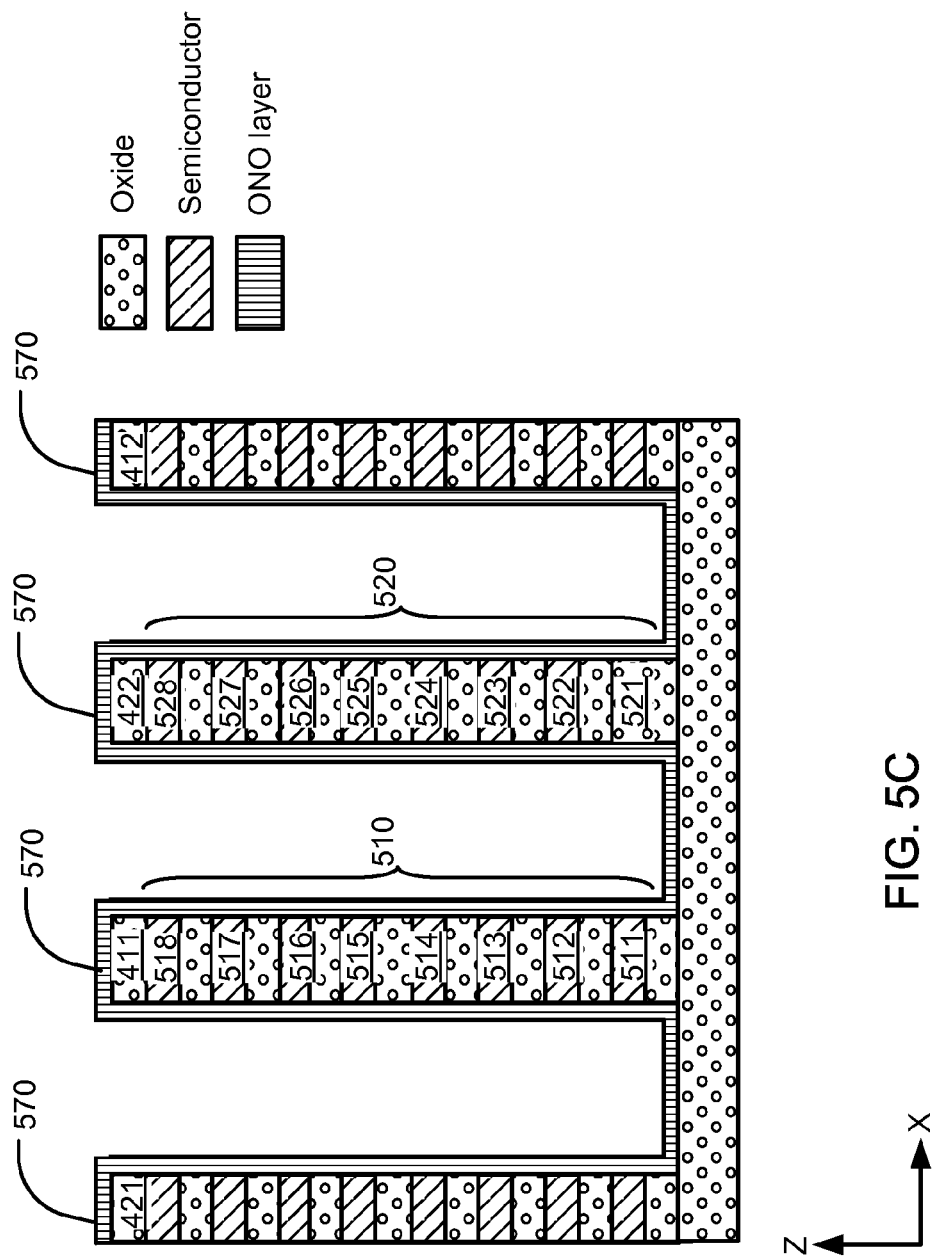

FIGS. 5A/5B/5C show results of forming a memory layer over the structure shown in FIGS. 4A/4B. FIG. 5A shows a top view of the structure, FIG. 5B is an enlarged view of area 590 in FIG. 5A, while FIG. 5C shows a cross-sectional view of the structure taken along C-C' in FIG. 5A.

A memory layer 570 is formed on surfaces of strips in the plurality of stacks of strips in the memory region 240, in the ground selection region 230, and in the second ground selection region 250. The memory layer can include multi-layer dielectric charge trapping structures known from flash memory technologies as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

As illustrated in the example of FIG. 5A, the plurality of layers of semiconductor material (e.g. 211-218) is not etched between the contact landing area region 210 and the switch region 220, not etched between the switch region 220 and the ground select region 230, not etched between the second ground select region 250 and the second switch region 260, and not etched between the second switch region 260 and the second contact landing area region 270. As further described in connection with FIGS. 7A and 7B, the plurality of layers of semiconductor material is etched to form portions of strips in the plurality of stacks of strips (e.g. 423, 413) in regions such as 581 between the switch region 220 and the ground select region 230 and 582 between the second switch region 260 and the second ground select region 250. So that the strips can extend towards respective pairs of holes (e.g. 423a and 423b, 413a and 413b) from an end of the strip opposite another end of the strip terminating with a pillar (e.g. 323, 313), and terminate at the contact landing area region 210 or the second contact landing area region 270.

Since the portions of the strips are formed after the memory layer is formed, the memory layer is not formed on surfaces of the portions of the strips, and thus dopant from the doped insulating material can be diffused into the portions of the strips, without being blocked by the memory layer, as described in connection with FIGS. 9A and 10A.

As illustrated in the example of FIG. 5B, the memory layer 570 is formed on surfaces of strips in the plurality of stacks of strips in the memory region 240, and in the ground selection region 230. The memory layer 570 is also formed on surfaces of the plurality of holes (e.g. 421a, 424b).

As illustrated in the example of FIG. 5C, a first stack 510 of strips includes strips 511-518 with an insulation strip 411 on top of the first stack, while a second stack 520 of strips includes strips 521-528 with an insulation strip 422 on top of the second stack. The memory layer 570 can be formed on surfaces of strips in the plurality of stacks of strips (e.g. 511-518, 521-528) in the memory region 240, in the ground selection region 230, and in the second ground selection region 250.

FIGS. 6A/6B show results of forming a layer of conductive material over the structure shown in FIGS. 5A/5B/5C. FIG. 6A shows a top view of the structure taken along D-D' in FIG. 6B, while FIG. 6B shows a cross-sectional view of the structure taken along C-C' in FIG. 6A.

FIG. 6A shows that a layer of conductive material (e.g. 610) is deposited over the memory region 240, the ground selection region 230 and the second ground selection region 250, including between the plurality of stacks of strips (e.g. 510, 520). The layer of conductive material can include polysilicon having n-type or p-type doping. The conductive material deposited between the stacks can be etched to form conductive lines such as word lines (e.g. 125-1 WL through 125-N WL, FIG. 1) and ground select lines (e.g. 126 GSL, 127 GSL, FIG. 1).

FIG. 6A also shows that the layer of conductive material is deposited in the plurality of holes (e.g. 421a-424a, 421b-424b, 411a-413a, and 411b-413b, FIG. 4) to form SSL switch gates (e.g. 621a-624a, 621b-624b, 611a-613a, and 611b-613b) in the switch region 220 and the second switch region 260.

FIG. 6B shows that the layer of conductive material 610 is deposited over and having a surface conformal with the memory layer 570 on the plurality of stacks of strips (e.g. 510, 520).

Figures 7A, 7B:
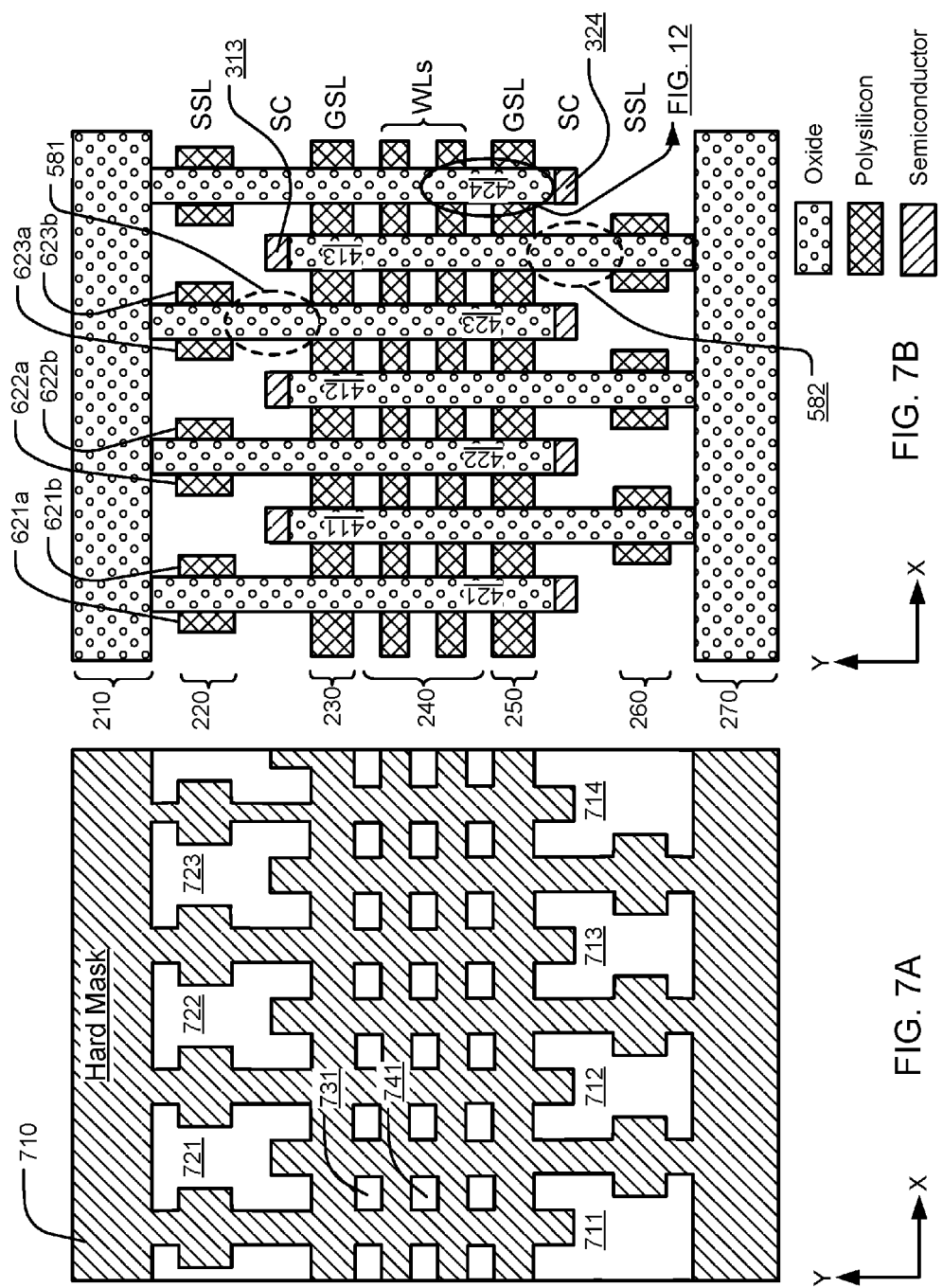

FIGS. 7A and 7B show the etching of the layer of conductive material (e.g. 610) to define a plurality of vertical conductive lines arranged over, and having surfaces conformal with, the memory layer (e.g. 570) on the plurality of stacks. FIG. 7A shows that a photoresist hard mask is formed over the structure shown in FIGS. 6A/6B. The hard mask is patterned to define mask regions (e.g. 710) and spaced apart open etch regions (e.g. 711-714, 721-723, 731). The mask regions correspond to the plurality of stacks of conductive strips, word lines (WL) in the memory region (e.g. 240), ground select lines (GSL) in the ground select region 230 and the second ground select region 250, source contacts (SC) between the switch region and the ground select region and between the second switch region and the second ground select region, string select structures (SSL) in the switch region (e.g. 220) and the second switch region (e.g. 260), and contact landing area regions (e.g. 210, 270). The spaced apart open etch regions (e.g. 711-714, 721-723, 731) are not protected by the mask regions and will be removed.

For instance, the spaced apart open etch regions 721-723 are between the contact landing area region 210 and the ground select region 230, and the spaced apart open etch regions 711-714 are between the second contact landing area region 270 and the second ground select region 250. The spaced apart open etch region 731 is surrounded by a ground select line (GSL), a word line (WL), and two strips (e.g. 411, 421). The spaced apart open etch region 741 is surrounded by two word line (WL), and two strips (e.g. 411, 421).

FIG. 7B shows results of etching the structure shown in FIGS. 6A/6B using the hard mask shown in FIG. 7A and reactive ion etching (RIE) for example, and after removing the hard mask and excess conductive material in the layer of conductive material (e.g. 610). A plurality of stacks of strips of semiconductor material (e.g. 411-413, 421-424) has a memory region (e.g. 240), a contact landing area region (e.g. 210), a switch region (e.g. 220) between the memory region and the contact landing area region, and a ground select region (e.g. 230) between the switch region and the memory region. The plurality of stacks of strips of semiconductor material can also have a second contact landing area region (e.g. 270), a second switch region (e.g. 260) between the memory region and the second contact landing area region, and a second ground select region (e.g. 250) between the second switch region and the memory region. Word lines (WLs) are formed over the memory region (e.g. 240). Ground select lines (GSL) are formed over the ground select regions (e.g. 230, 250). SSL switch gates (e.g. 621a-624a, 621b-624b) are formed over the switch regions (e.g. 220, 260).

A row of source contact conductors (e.g. 321-324, FIG. 3) can be in contact with strips of semiconductor material (e.g. 421-424) at an end of the strips opposite the contact landing area region 210, while a second row of source contact conductors (e.g. 311-313, FIG. 3) can be in contact with strips of semiconductor material (e.g. 411-413) at an end of the strips opposite the second contact landing area region 270. Contact landing area regions (e.g. 210, 270) are further processed as shown in FIGS. 8A and 8B.

Figures 11, 12:
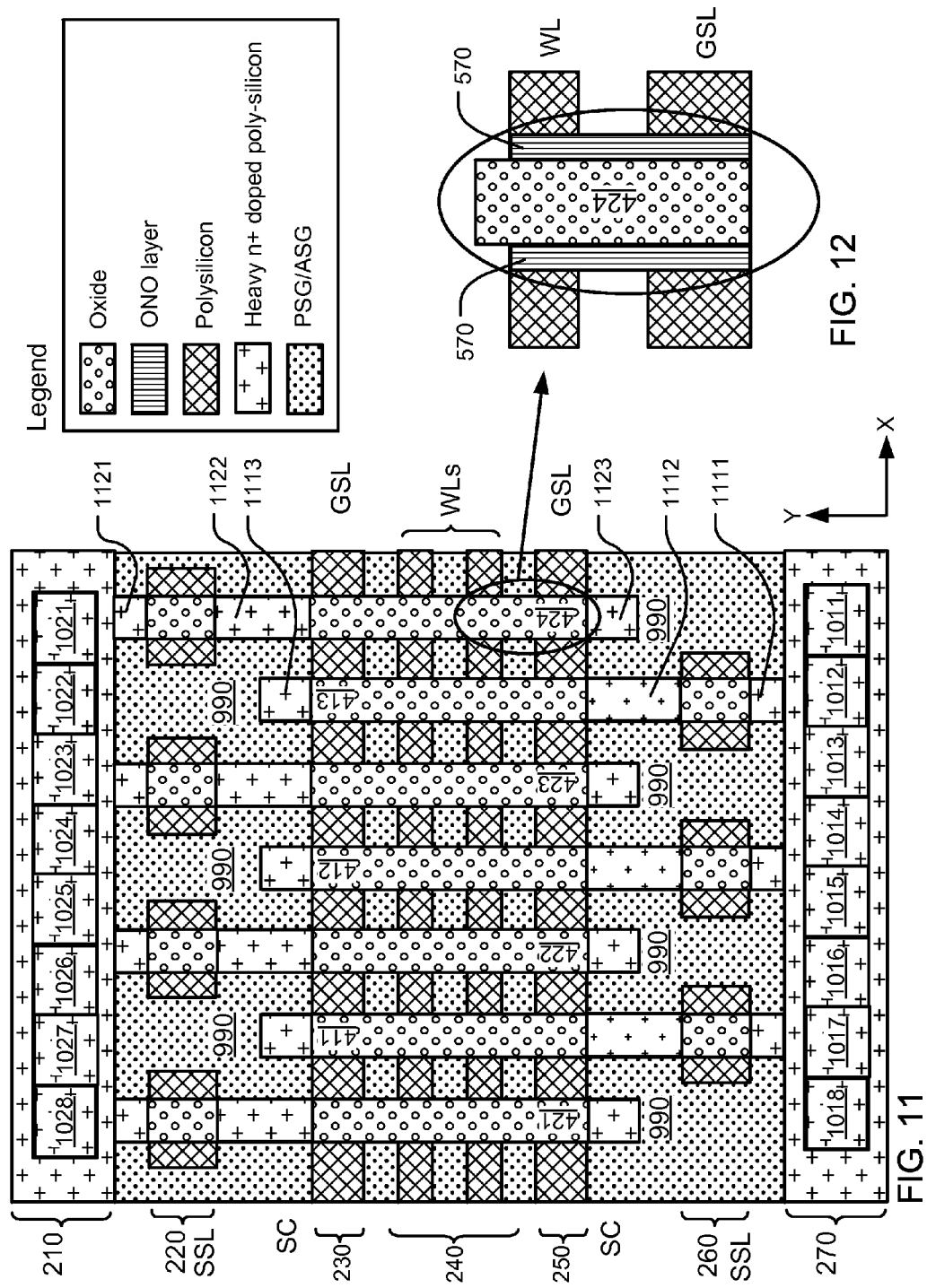

The memory layer (e.g. 570) is formed in interface regions at cross-points between surfaces of strips in the plurality of stacks (e.g. 424) and the word lines (WLs) in the memory region 240 and the ground select line (GSL) in the ground select regions 230 and 250, as shown in detail in FIG. 12. The memory layer (e.g. 570) is not formed on surfaces of portions of the strips in regions such as 581 and 582 between the switch region 220 and the ground select region 230, and between the second ground selection region 250 and the second switch region 260. The memory layer also is not formed on surfaces of portions of the strips between the contact landing area region 210 and the switch region 220, and between the second contact landing area region 270 and the second switch region 260.

Figures 8A, 8B:
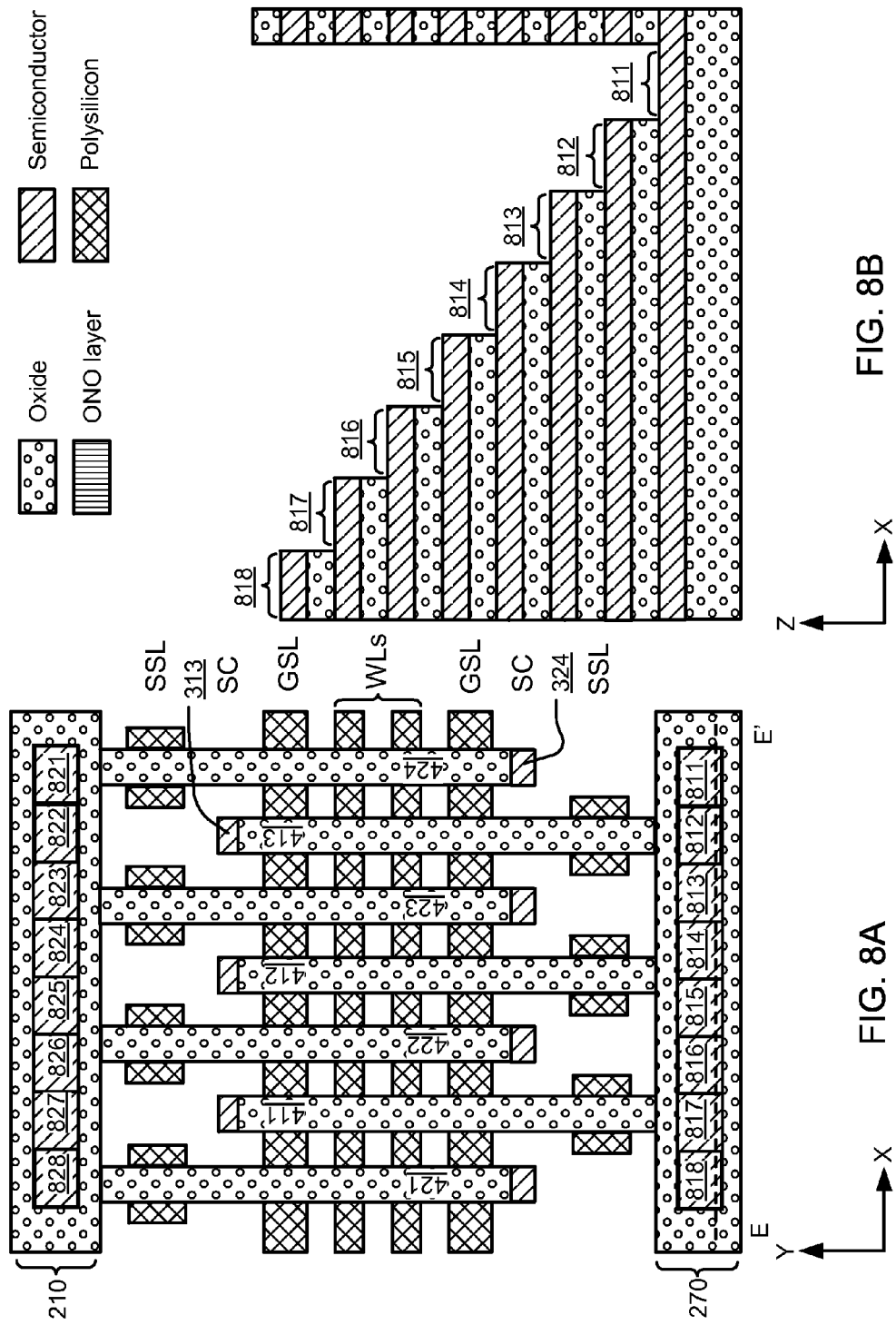

FIGS. 8A/8B show the results of etching the plurality of layers of semiconductor material to form a stack of linking elements (bit line pads) separated by insulating layers and connected to respective strips in the plurality of stacks of strips. Linking elements are used for selection of planes of memory cells. FIG. 8A shows a top view of the structure after the etching, while FIG. 8B shows a cross-sectional view of the structure taken along E-E' in FIG. 8A.

FIG. 8A shows openings for landing areas on each layer in a staircase configuration (e.g. 811-818) for a first stack of linking elements connected to and terminating stacks of strips including strips 411-413 in the second contact landing area region (e.g. 270), and openings for landing areas on each layer in a staircase configuration (e.g. 821-828) for a second stack of linking elements connected to and terminating stacks of strips including strips 421-424 in the contact landing area region (e.g. 210). Strips in multiple stacks of strips in the same layer are electrically coupled together by linking elements. For instance, the first stack of linking elements shown in FIG. 8B can be connected to and terminate respective strips 511-518 and strips 521-528 (FIG. 5). In particular, the linking element corresponding to opening 811 can terminate strips 511 and 521, the linking element corresponding to opening 812 can terminate strips 512 and 522, . . . the linking element corresponding to opening 818 can terminate strips 518 and 528.

Figure 9B:
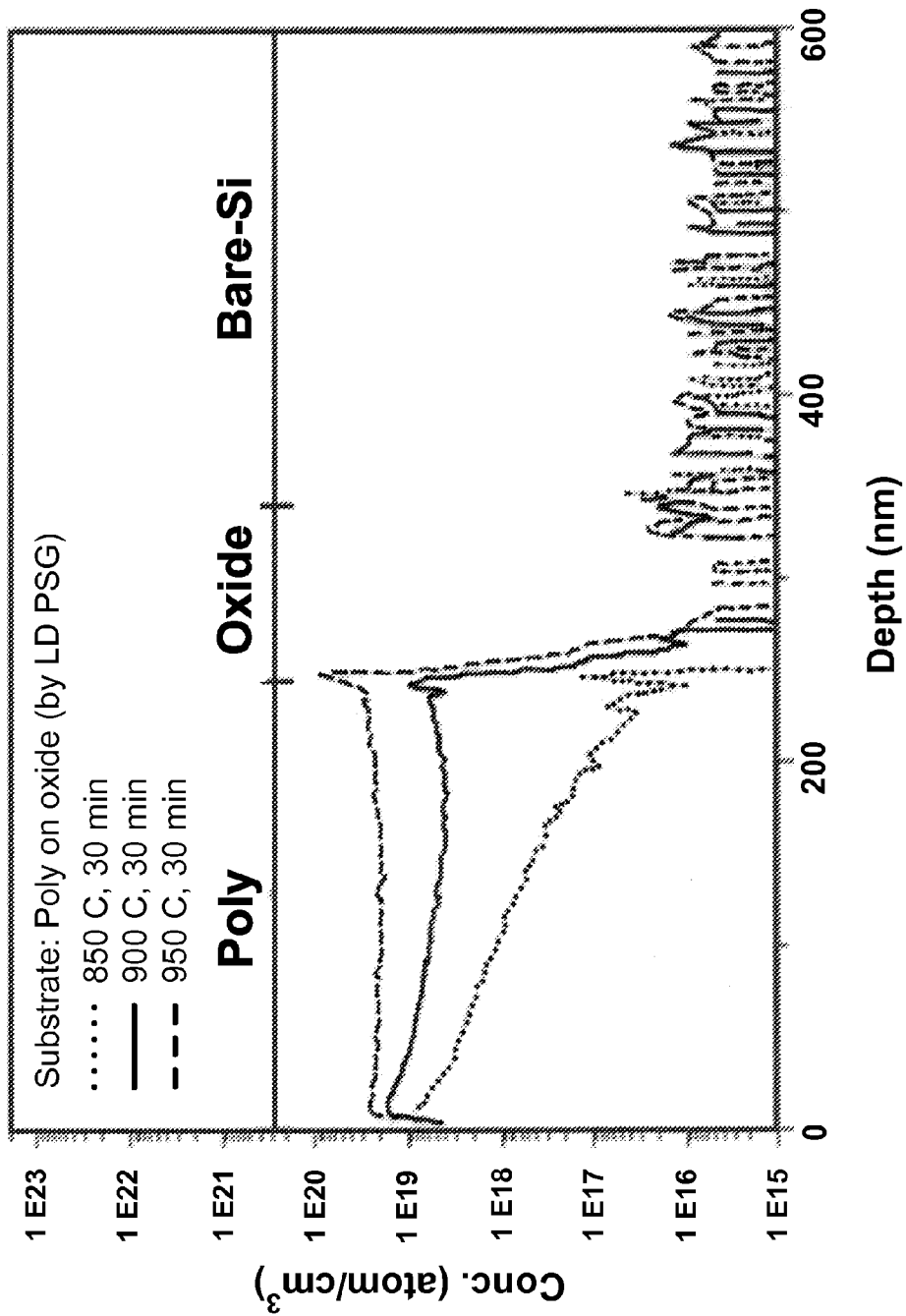

FIGS. 9A and 9B show results of depositing a doped insulating material over portions of the strips between the contact landing area region 210 and the ground select region 230, and over portions of the strips between the second contact landing area region 270 and the second ground select region 250. The doped insulating material (e.g. 990) can include PSG (phosphosilicate glass film) or ASG (arsenosilicate glass film) for forming n+ junction or BSG (borosilicate glass film) for forming p+ junction.

Stacks of linking elements can be formed in the contact landing area region (e.g. 210) and the second contact landing area region (e.g. 270) before or after the doped insulating material is deposited over the structure. If the linking elements are formed before the doped insulating material is deposited over the structure, the doped insulating material can be deposited over the stacks of linking elements in the contact landing area region and the second contact landing area region in the same doping process. If the linking elements are formed after the doped insulating material is deposited over the structure, a second doping process of the doped insulating material can be applied to the contact landing area region (e.g. 210) and the second contact landing area region.

For clarity, the doped insulating material is not shown over the linking elements, the strips (e.g. 411-413, 421-424), source contact conductors (e.g. 311-313, 321-324, FIG. 3A), SSL switch gates (e.g. 621a-624a, 621b-624b, 611a-613a, 611b-613b, FIG. 6), word lines (WLs), and ground select lines (GSL). A doped insulating material can be deposited by using the ALD (atomic layer deposition) tool, which is capable of depositing the doped insulating material in small gaps in a 3D NAND structure having a high aspect ratio profile, such as between the contact landing area region and the ground select region (e.g. 721-723, 711-714, FIG. 7A).

After the doped insulating material is deposited, a drive-in process can be performed to cause diffusion of dopant from the doped insulating material into portions of the strips in the stacks of strips, and into the contact landing area region and the second contact landing area region, as further described in connection with FIGS. 10A and 10B.

FIG. 9B is a diagram showing example temperature ranges and time durations for a drive-in process. As shown in the diagram, at temperature of 950 C and over a time duration of about 30 minutes, PSG concentration in polysilicon can be increased to over $1E19$ atom/cm$^3$, for depths up to about 270 nanometers (nm). At temperature of 900 C and over a time duration of about 30 minutes, PSG concentration in polysilicon can be increased to about $1E19$ atom/cm$^3$, for depths up to about 270 nm. At temperature of 850 C and over a time duration of about 30 minutes, PSG concentration in polysilicon can be increased to about $1E18$ atom/cm$^3$, for depths up to about 100 nm. In comparison, under the same temperature and time duration conditions, PSG concentration in oxide and bare-silicon is below about 1E16 atom/cm$^3$.

An alternative method to the drive-in process using doped insulating material can be ion implantation. However, in a three-dimensional (3D) memory structure such as a 3D NAND structure, an ion implantation process needs to consider its angle of incidence and dosages distribution. For instance, for a 3D NAND structure with 16 layers or 32 layers, the dosage control of implantation can be very difficult due to the shadowing effect of high aspect ratio profile, where strips higher in one stack of strips can reduce amount of ion implantation received by strips lower in an adjacent stack of strips. Consequently, memory cells in higher layers of a 3D NAND structure can have higher current due to higher doping dosages received than memory cells in lower layers of the 3D NAND structure. Threshold voltage distribution of the 3D NAND structure can thus become wider by using the ion implantation. In addition, the ion bombardment used in ion implantation may cause damage to bit lines.

By using a doped insulating material as doping source, where the dosage of the doped material is about the same from a top layer to a bottom layer in a 3D NAND structure, the doping distribution can be better controlled through the layers in a 3D NAND structure. Consequently, threshold voltage distribution of the 3D NAND structure can become narrower by using a doped insulating material as doping source.

An improvement by the present technology is to provide more uniform doping distribution in portions of the strips of semiconductor material between the linking elements and the SSL switch gates, and between the SSL switch gates and the ground select lines, through multiple layers in the 3D structure.

Figures 10A, 10B:
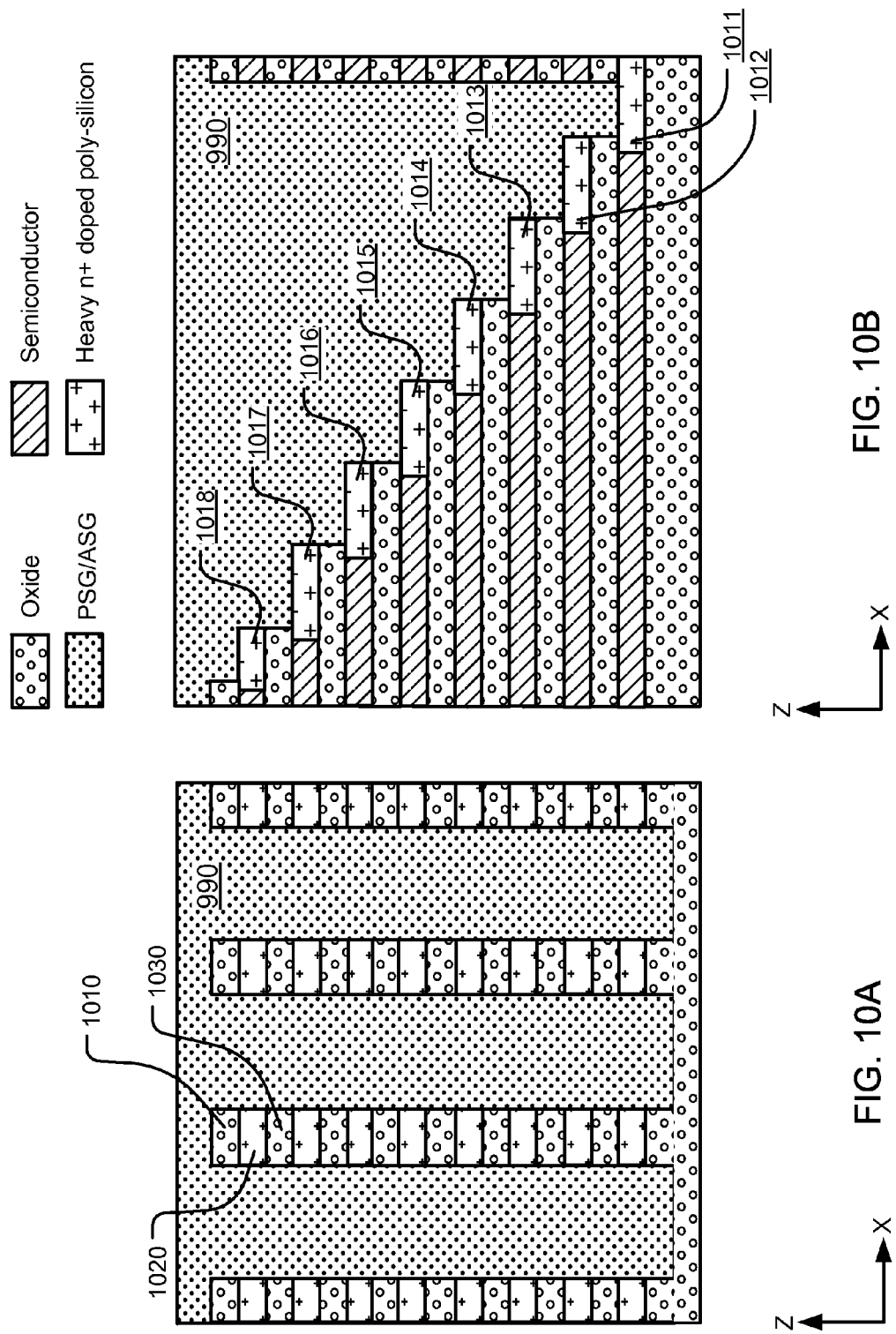

FIG. 10A is a cross-sectional view of the structure after the doped insulating material (e.g. 990) is deposited and dopant from the doped insulating material is diffused into portions of the strips. The cross-sectional view is taken along F-F' in FIG. 9A, between the contact landing area region (e.g. 210) including a stack of linking elements (e.g. 821-828) and the switch region (e.g. 220) including SSL switch gates (e.g. 621a-624a, 621b-624b, FIG. 6A). The cross-sectional view shows stacks of strips of heavy n+doped polysilicon (e.g. 1020) between insulating material (e.g. 1010, 1030) such as buried oxide, as a result of diffusion of dopant from the doped insulating material, such as PSG or ASG, into portions of the strips of semiconductor material between the contact landing area region (e.g. 210) and the switch region (e.g. 220). Alternatively, if the doped insulating material includes BSG instead of PSG or ASG, the stacks of strips can include p+ doped polysilicon instead of n+ doped polysilicon in portions of the strips between the contact landing area region and the switch region.

The cross-sectional view shown in FIG. 10A can also illustrate a cross-section taken along G-G' in FIG. 9A, between the SSL switch gates (e.g. 621a-624a, 621b-624b, FIG. 6A) and the ground select lines (GSL). Description of the cross-sectional view taken along F-F' in FIG. 9A is generally applicable to the cross-section taken along G-G' in FIG. 9A.

Depending on the fill-in ability of the process to deposit the doped insulating material, portions of the strips between word lines (WLs) and between WLs and ground select lines (GSL) may be diffused with dopant from the doped insulating material, or may be un-doped. As a NAND string can be junction free or can include junctions, whether the portions of the strips between word lines (WLs) and between WLs and ground select lines (GSL) is diffused with dopant to form inter-WL junctions from the doped insulating material can be a design choice.

FIG. 10B is a cross-sectional view of the structure after depositing PSG, taken along H-H' in the second contact landing area region 270 in FIG. 9A, across a stack of linking elements, such as the first stack of linking elements corresponding to openings 811-818. Landing areas (e.g. 1011-1018) in respective linking elements are diffused of dopant from the doped insulating material (e.g. 990), and thus include heavy n+ doped poly-silicon if the doped insulating material includes PSG or ASG. Alternatively, if the doped insulating material includes BSG instead of PSG or ASG, the landing areas in the linking elements can include p+ doped polysilicon instead of n+ doped polysilicon.

The cross-sectional view shown in FIG. 10B can also illustrate a cross-section taken along J-J' in the contact landing area region 210 in FIG. 9A, across a stack of linking elements, such as the second stack of linking elements corresponding to openings 821-828. Landing areas (e.g. 1021-1028, FIG. 11) in respective linking elements are diffused of dopant from the doped insulating material (e.g. 990), and thus include heavy n+ doped poly-silicon if the doped insulating material includes PSG or ASG. Description of the cross-sectional view taken along H-H' in FIG. 10B is generally applicable to the cross-section taken along J-J' in FIG. 10B.

In further processing, a plurality of interlayer connectors (e.g. 172-175, FIG. 1) can be formed extending from a connector surface to the landing areas. Patterned conductor lines (e.g. ML3, FIG. 1) can be formed on top of the connector surface and connected to respective interlayer connectors. The patterned conductor lines can include a plurality of global bit lines coupled to sensing circuits (not shown).

FIG. 11 shows a top view of the structure after dopant from the doped insulating material is diffused into portions of the strips. The structure includes a plurality of stacks of strips of semiconductor material (e.g. 411-413, 421-424) having a memory region (e.g. 240), a contact landing area region (e.g. 210) and a switch region (e.g. 220) between the memory region and the contact landing area region. The plurality of stacks of strips of semiconductor material also has a second contact landing area region in the strips (e.g. 270) at ends opposite the first mentioned contact landing area region, a second switch region (e.g. 260) between the memory region and the second contact landing area region, a ground select region (e.g. 230) between the switch region and the memory region, and a second ground select region (e.g. 250) between the second switch region and the memory region.

The memory layer (e.g. 570) is formed in interface regions at cross-points between surfaces of strips in the plurality of stacks (e.g. 424) and the word lines (WLs) in the memory region 240 and the ground select lines (GSL) in the ground select region 230 and the second ground select region 250, as shown in detail in FIG. 12. A plurality of memory cell gates (WLs) is formed over the memory region 240 of the strips. The memory cell gates block diffusion of the dopant from the doped insulating material into portions of the memory region of the strips. SSL switch gates are formed over the switch region 220 of the strips, and can also be formed over the second switch region 260 of the strips. GSL switch gates are formed over the ground select region 230 of the strips, and can also be formed over the second ground select region 250 of the strips.

The doped insulating material (e.g. 990) is deposited over portions of the strips between the contact landing area region (e.g. 210) and the ground select region (e.g. 230), and between the second contact landing area region (e.g. 270) and the second ground select region (e.g. 250). The doped insulating material remains in the structure after dopant from the doped insulating material is diffused into portions of the strips, and does not need to be removed because the doped insulating material can act as isolation between the strips (e.g. 411-413, 421-424).

Portions of the strips between the contact landing area region and the switch region (e.g. 1121) and between the switch region and the ground select region (e.g. 1122) include dopant diffused from the doped insulating material. Portions of the strips between the second contact landing area region and the second switch region (e.g. 1111) and between the second switch region and the second ground select region (e.g. 1112) also include diffused dopant from the doped insulating material.

The structure includes source contact conductors (e.g. 324, FIG. 8A) in contact with the strips at ends of the strips opposite the contact landing area region (e.g. 210), and end regions (e.g. 1123) between the source contact conductors and the second ground select region of the strips (e.g. 250). The end regions (e.g. 1123) can include dopant diffused from the doped insulating material.

The structure can include a second contact landing area region (e.g. 270) at ends opposite the first mentioned contact landing area region (e.g. 210), source contact conductors (e.g. 313, FIG. 8A) in contact with the strips at ends of the strips opposite the second contact landing area region (e.g. 270), and end regions (e.g. 1113) between the source contact conductors and the ground select region of the strips (e.g. 230). The end regions (e.g. 1113) can include dopant diffused from the doped insulating material.

The doped insulating material 990 can be deposited over the contact landing area region of the strips (e.g. 210), and the contact landing area region can include dopant diffused from the doped insulating material, such that the contact landing area region can include heavy n+ doped polysilicon if the doped insulating material includes PSG or ASG. Alternatively, if the doped insulating material includes BSG, the contact landing area region can include heavy p+ doped polysilicon. The doped insulating material 990 can be deposited over the second contact landing area region of the strips (e.g. 270), and the second contact landing area region can include dopant diffused from the doped insulating material.

Figure 13:
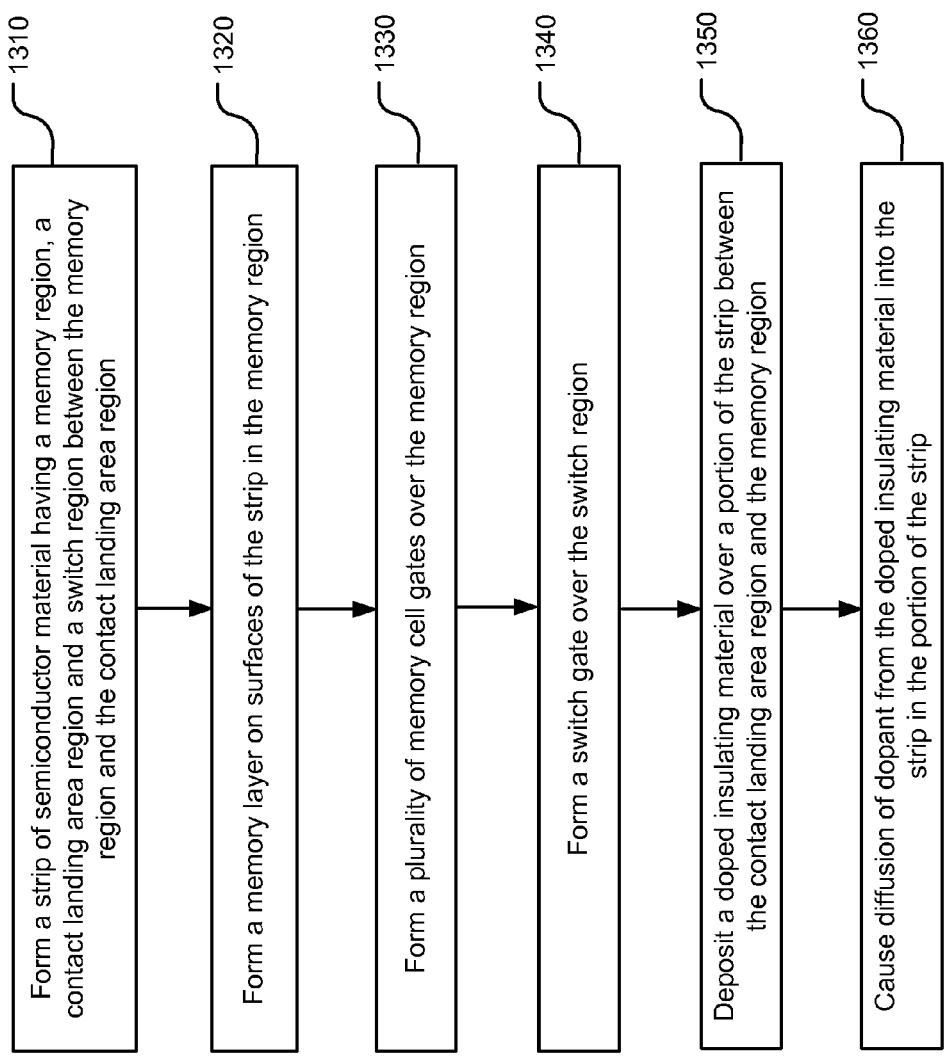
FIG. 13 illustrates a simplified flowchart of an embodiment of a method for manufacturing a memory device.

FIG. 13 illustrates a simplified flowchart of an embodiment of a method for manufacturing a memory device. The present technology provides a method for manufacturing a memory device. A strip of semiconductor material is formed having a memory region, a contact landing area region and a switch region between the memory region and the contact landing area region (Step 1310). A memory layer is formed on surfaces of the strip in the memory region (Step 1320). A plurality of memory cell gates is formed over the memory region of the strip (Step 1330). A switch gate is formed over the switch region of the strip (Step 1340). A doped insulating material is deposited over a portion of the strip between the contact landing area region and the memory region (Step 1350). Diffusion of dopant is caused from the doped insulating material into the strip in the portion of the strip, for example by a drive-in process (Step 1360).

In reference to Step 1350, stacks of linking elements can be formed in the contact landing area region (e.g. 210) and the second contact landing area region (e.g. 270) before or after the doped insulating material is deposited over the structure. If the linking elements are formed before the doped insulating material is deposited over the structure, the doped insulating material can be deposited over the stacks of linking elements in the contact landing area region and the second contact landing area region in the same doping process. If the linking elements are formed after the doped insulating material is deposited over the structure, a second doping process of the doped insulating material can be applied to the contact landing area region (e.g. 210) and the second contact landing area region.

FIGS. 14A, 14B, and 14C show a top view of an alternative 3D structure using a doped insulating material as doping source. The alternative 3D structure is like a so called IDG (independent double gate) structure, which uses one set of SSL gate structures instead of two sets of SSL gate structures, and one ground select line (GSL) instead of two ground select lines.

A plurality of stacks of strips of semiconductor material has a memory region (e.g. 1430), a contact landing area region (e.g. 1410), and a switch region (e.g. 1420) between the memory region and the contact landing area region. Strips in the stacks (e.g. 1431-1437) terminate at one end on the contact landing area region, and terminate at another end on a source pad region (e.g. 1450). In the contact landing area region (e.g. 1410), openings for landing areas (e.g. 1411-1418) are shown on each layer in a staircase configuration for a stack of linking elements connected to and terminating stacks of strips (e.g. 1431-1437). The plurality of stacks of strips of semiconductor material has a ground select region (e.g. 1440) between the memory region and the source pad region. Openings for landing areas (e.g. 1451-1458) are shown on each layer in a staircase configuration for a stack of linking elements connected to and terminating stacks of strips (e.g. 1431-1437) in the source pad region.

A doped insulating material (e.g. 1490) is deposited over portions of the strips between the contact landing area region (e.g. 1410) and the memory region (e.g. 1430) and between the memory region (e.g. 1430) and the source pad region (e.g. 1450), over the contact landing area region (e.g. 1410) including a stack of linking elements (e.g. 1411-1318), and over the source pad region 1450. The doped insulating material (e.g. 1490) can be PSG (phosphosilicate glass film) or ASG (arsenosilicate glass film) for forming n+ junction, or BSG (borosilicate glass film) for forming p+ junction. Dopant from the doped insulating material can be diffused into the portions of the strips, the contact landing area region, and the source pad region.

A memory layer (e.g. 1470) is formed in interface regions at cross-points between surfaces of strips in the plurality of stacks and the word lines (WLs) in the memory region 1430, as shown in detail in FIG. 14B. A plurality of memory cell gates (WLs) is formed over the memory region 1430 of the strips. The memory cell gates block diffusion of the dopant from the doped insulating material into portions of the memory region of the strips. SSL switch gates (e.g. 1421-1428) are formed over the switch region 1420 of the strips.

The doped insulating material (e.g. 1490) is deposited over portions of the strips between the contact landing area regions (e.g. 1410) and the switch region 1420, between the switch region (e.g. 1420) and the memory region (e.g. 1430), and between the memory region (e.g. 1430) and the source pad region (e.g. 1450). The doped insulating material (e.g. 1490) can also be deposited over portions of the strips between word lines (WLs), and between the ground select line (GSL) and a word line. The doped insulating material remains in the structure after dopant from the doped insulating material is diffused into portions of the strips, and does not need to be removed because the doped insulating material can act as isolation between the strips (e.g. 1431-1437).

Portions of the strips between the contact landing area region and the switch region (e.g. 1427a) and between the switch region and the memory region (e.g. 1437a) can include dopant diffused from the doped insulating material (e.g. 1490). Portions of the strips between the memory region and the source pad region (e.g. 1437b) can also include diffused dopant from the doped insulating material.

The doped insulating material 1490 can be deposited over the contact landing area region of the strips (e.g. 1410), and the contact landing area region can include dopant diffused from the doped insulating material, such that the contact landing area region can include heavy n+ doped polysilicon if the doped insulating material includes PSG or ASG. Alternatively, the contact landing area region can include heavy p+ doped polysilicon if the doped insulating material includes BSG.

FIG. 14C shows a cross-sectional view of the structure taken along K-K' in the source pad region (e.g. 1450) in FIG. 14A. Description about the structure shown in FIG. 8B is generally applicable to the structure in FIG. 14C.

FIGS. 15 through 19 illustrate stages in a basic process flow for manufacturing a memory device like that of FIGS. 14A/B. FIG. 15 shows area 1460 in FIG. 14A, at a stage in the basic process flow after the memory layer (e.g. 1470) is formed on surfaces of strips in the plurality of stacks (e.g. 1433-1436) in the memory region (e.g. 1430) with trenches between the stacks (e.g. 1533-1537). The memory layer can also be formed on surfaces of SSL holes (e.g. 1523-1527), and be used as gate dielectric in string select line (SSL) switches. The stage shown in FIG. 15 is similar to the stage shown in FIGS. 5A/5B/5C for the first mentioned 3D structure.

A layer of conductive material is then deposited over the memory region 1430, including in the trenches between the stacks (e.g. 1533-1537). The layer of conductive material has a surface conformal with the memory layer 1470 on the plurality of stacks of strips. The layer of conductive material can include polysilicon having n-type or p-type doping. The conductive material deposited between the stacks can be etched to form conductive lines such as word lines (e.g. 125-1 WL through 125-N WL, FIG. 1) and ground select lines (e.g. 126 GSL, 127 GSL, FIG. 1). The layer of conductive material can also be deposited in the plurality of SSL holes (e.g. 1523-1527) to form SSL switch gates in the switch region 1420.

FIG. 16 shows that a photoresist hard mask is formed over the structure shown in FIG. 15, after the layer of conductive material is deposited. The hard mask is patterned to define mask regions (e.g. 1610) and spaced apart open etch regions (e.g. 1623-1627, 1633-1637, and 1643-1647). The mask regions correspond to the contact landing area region (e.g. 1410), the switch region (e.g. 1420), the word lines (WL) and ground select lines (GSL) in the memory region (e.g. 1430), the source pad region (e.g. 1450), and the plurality of stacks of conductive strips (e.g. 1433-1436). The spaced apart open etch regions (e.g. 1623-1627, 1633-1637, and 1643-1647) are not protected by the mask regions and will be removed.

For instance, the spaced apart open etch regions 1623-1627 are between the contact landing area region 1410 and the switch region 1420, and the spaced apart open etch regions 1633-1637 are between the switch region 1420 and the memory region 1430. The spaced apart open etch regions 1643-1647 are surrounded by word lines (WLs), and strips in the memory region.

Figure 17:
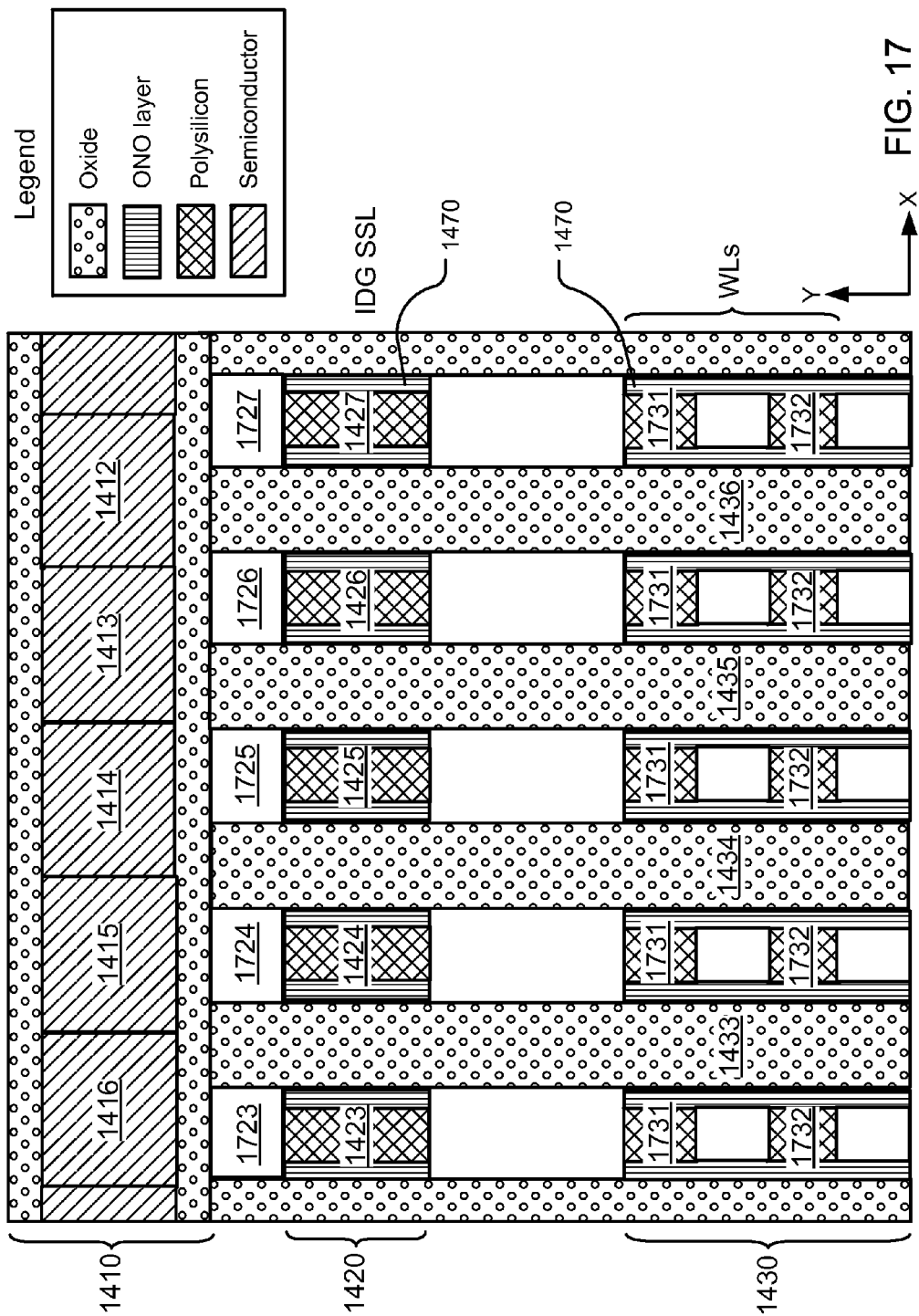

FIG. 17 shows results of etching the structure shown in FIG. 15 using the hard mask shown in FIG. 16 and reactive ion etching (RIE) for example, and after removing the hard mask and excess conductive material in the layer of conductive material. A plurality of stacks of strips of semiconductor material (e.g. 1433-1436) is arranged orthogonal to the word lines (WLs) in the memory region (e.g. 1430). A switch region (e.g. 1420) is arranged between the memory region 1430 and the contact landing area region (e.g. 1410). SSL switch gates (e.g. 1423-1427) are formed over the switch region 1420.

The memory layer (e.g. 1470) is formed in interface regions at cross-points between surfaces of strips in the plurality of stacks (e.g. 1433-1436) and the word lines (e.g. 1731, 1732) in the memory region 1430. Stacks of linking elements, such as the stack of linking elements corresponding to openings 1411-1418 in FIG. 14A, can be further formed in the contact landing area region (e.g. 1410) before or after a doped insulating material is deposited over the structure as described in connection with FIG. 18.

Figure 18:
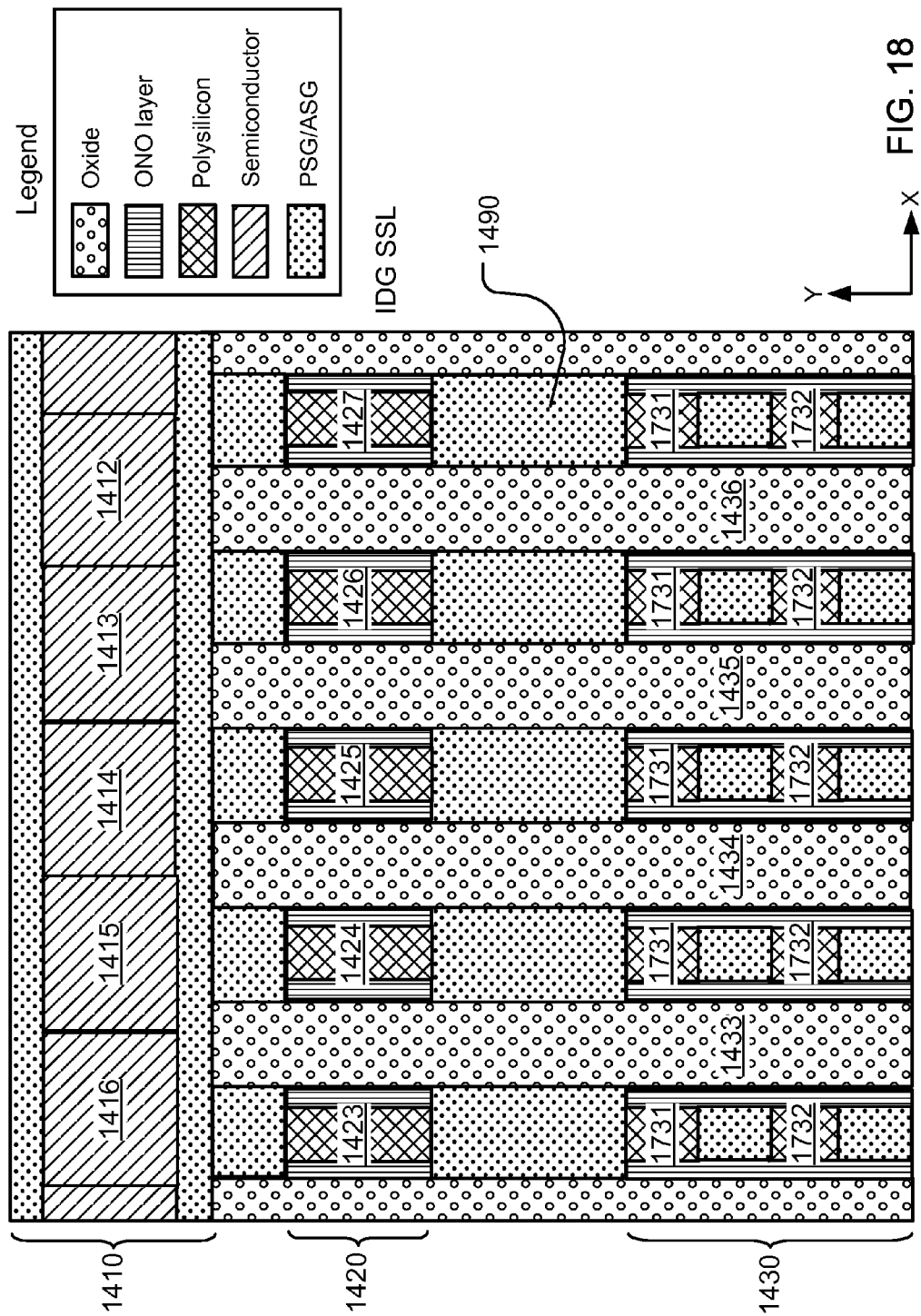

FIG. 18 shows results of depositing a doped insulating material over portions of the strips between the contact landing area region and the memory region, and over the stack of linking elements in the contact landing area region. The doped insulating material (e.g. 1490) can be PSG (phosphosilicate glass film) or ASG (arsenosilicate glass film) for n+ junction or BSG (borosilicate glass film) for p+ junction. For clarity, the doped insulating material is not shown over the linking elements (e.g. 1412-1416), strips (e.g. 1433-1436), SSL switch gates (e.g. 1423-1427), and word lines (e.g. 1731, 1732). A doped insulating material can be deposited by using the ALD (atomic layer deposition) tool, which is capable of depositing the doped insulating material in small gaps in a 3D NAND structure having a high aspect ratio profile, such as between the contact landing area region and the switch region (e.g. 1723-1727, FIG. 17).

Figure 19:
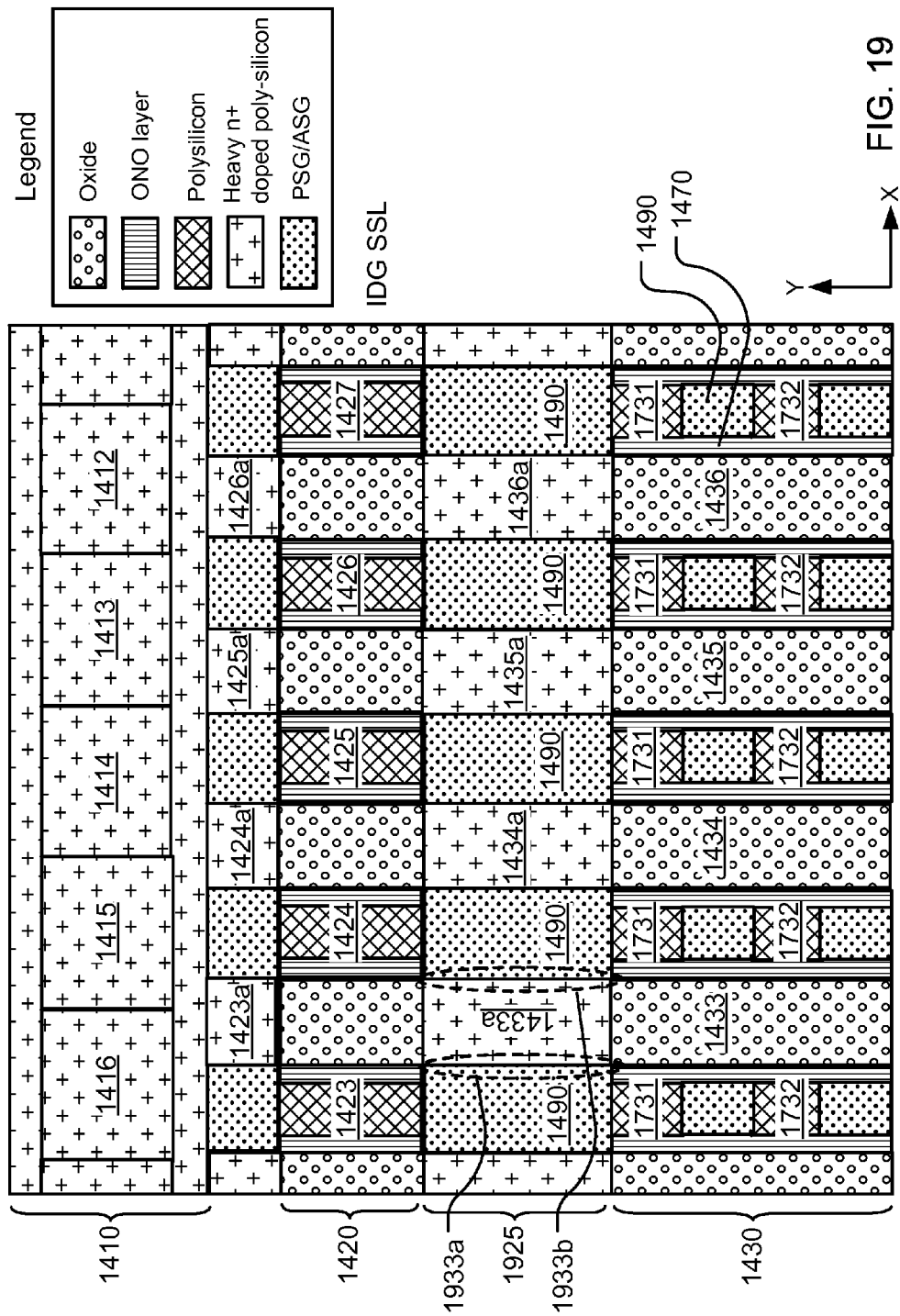

FIG. 19 shows a top view of the structure after dopant from the doped insulating material is diffused into portions of the strips.

The doped insulating material (e.g. 990) is deposited over portions of the strips between the contact landing area region (e.g. 1410) and the memory region (e.g. 1430). The doped insulating material remains in the structure after dopant from the doped insulating material is diffused into portions of the strips, and does not need to be removed because the doped insulating material can act as isolation between the strips (e.g. 1433-1436).

Portions of the strips between the contact landing area region and the switch region (e.g. 1423a-1426a) and between the switch region and the memory region (e.g. 1433a-1436a) include dopant diffused from the doped insulating material. Portions of the strips between the source pad region (e.g. 1450, FIG. 14A) and the memory region (e.g. 1437b, FIG. 14A) can also include diffused dopant from the doped insulating material.

The doped insulating material 1490 can be deposited over the contact landing area region (e.g. 1410), and the contact landing area region can include dopant diffused from the doped insulating material, such that the contact landing area region can include heavy n+ doped polysilicon if the doped insulating material includes PSG or ASG. Alternatively, if the doped insulating material includes BSG, the contact landing area region can include heavy p+ doped polysilicon. The doped insulating material 1490 can be deposited over the source pad region (e.g. 1450, FIG. 14), and the source pad region can include dopant diffused from the doped insulating material.

In the memory region (e.g. 1430), the memory layer (e.g. 1470) can stop diffusion of dopant from the doped insulating material (e.g. 1490) into portions of the strips (e.g. 1436) in the memory region. In a region (e.g. 1925) between the switch region (1420) and the memory region (e.g. 1430), the memory layer (e.g. 1470) is not deposited on surfaces of the strips (e.g. 1933a, 1933b) in the region. This region without the memory layer can form an N+ region after dopant from the doped insulating material (e.g. 1490) is diffused into portions of the strips in the region (e.g. 1433a-1436a), if the doped insulating material includes PSG or ASG. Alternatively, the region without the memory layer can form a P+ region if the doped insulating material includes BSG.

Figure 20:
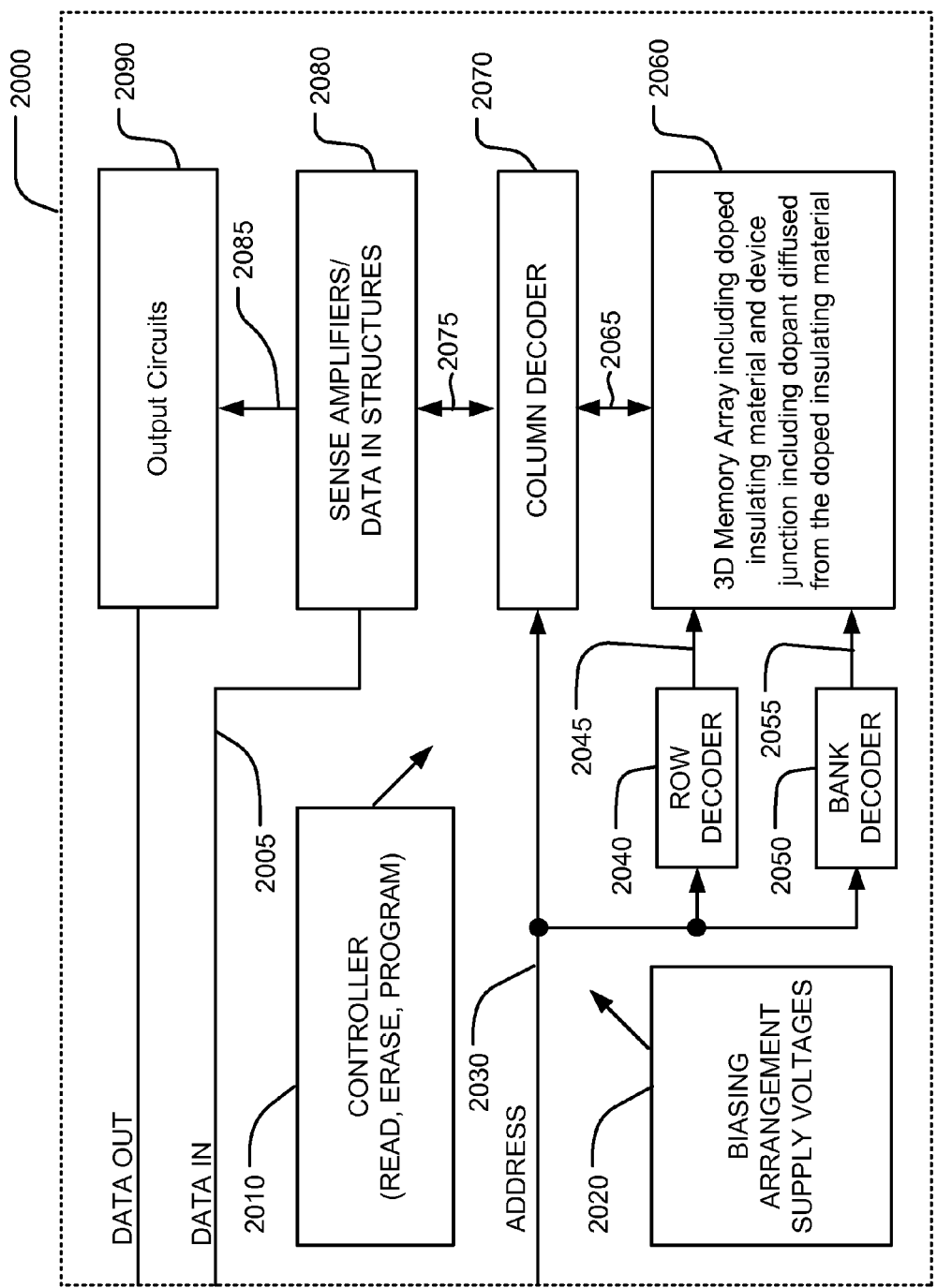
FIG. 20 is a simplified block diagram of an integrated circuit memory device according to an embodiment.

FIG. 20 is a simplified block diagram of an integrated circuit memory device according to an embodiment. The integrated circuit 200 includes a 3D memory array 2060 on an integrated circuit substrate. The memory array 2060 includes doped insulating material and device junction including dopant diffused from the doped insulating material.

The memory array 2060 includes a plurality of stacks of strips of semiconductor material having a memory region, a contact landing area region and a switch region between the memory region and the contact landing area region. The memory array 2060 can also include a second contact landing area region and a second switch region between the memory region and the second contact landing area region.

A doped insulating material, such as PSG, ASG or BSG, is deposited over portions of the strips between the contact landing area regions and the memory region. Portions of the strips between the contact landing area region and the switch region and between the switch region and the memory region include dopant diffused from the doped insulating material. Portions of the strips between the second contact landing area region and the second switch region and between the second switch region and the memory region can also include diffused dopant from the doped insulating material.

The memory array 2060 can include source contact conductors in contact with the strips at ends of the strips opposite the contact landing area region, and end regions between the source contact conductors and the memory region of the strips. The end regions can include dopant diffused from the doped insulating material. The memory array 2060 can include source contact conductors in contact with the strips at ends of the strips opposite the second contact landing area region, and end regions between the source contact conductors and the memory region of the strips. The end regions can include dopant diffused from the doped insulating material.

The doped insulating material can be deposited over the contact landing area region of the strips, and the contact landing area region can include dopant diffused from the doped insulating material. The doped insulating material can be deposited over the second contact landing area region of the strips, and the second contact landing area region can include dopant diffused from the doped insulating material.

A row decoder 2040 is coupled to a plurality of word lines 2045, and arranged along rows in the memory array 2060. A column decoder 2070 is coupled to a plurality of bit lines 2065 arranged along columns in the memory array 2060 for reading and programming data from the memory cells in the memory array 2060. A bank decoder 2050 is coupled to a plurality of banks in the memory array 2060 on bus 2055. Addresses are supplied on bus 2030 to column decoder 2070, row decoder 2040 and bank decoder 2050. Sense amplifiers and data-in structures in block 2080 are coupled to the column decoder 2070, in this example via data bus 2075. Sensed data from the sense amplifiers are supplied via output data lines 2085 to output circuits 2090. Output circuits 2090 drive the sensed data to destinations external to the integrated circuit 2000. Input data is supplied via the data-in line 2005 from input/output ports on the integrated circuit 2000 or from other data sources internal or external to the integrated circuit 2000, such as a general purpose processor or special purpose application circuitry, or a combination of modules providing system-on-a-chip functionality supported by the 3D memory array 2060, to the data-in structures in block 2080.

In the example shown in FIG. 20, a controller 2010 using a bias arrangement state machine controls the application of bias arrangement supply voltage generated or provided through the voltage supply or supplies in block 2020, such as read and program voltages. The controller 2010 can include modes of operation for multi-level cell (MLC) programming and reading. The controller 2010 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A method for manufacturing a memory device, comprising:
    forming a strip of semiconductor material having a memory region, a first contact landing region and a switch region between the memory region and the first contact landing region;
    forming a hole through layers of the semiconductor material in the switch region;
    forming a memory layer on surfaces of the strip in the memory region, on surfaces of the hole in the switch region, and not on any surfaces of the strip between the first contact landing region and the switch region;
    forming a plurality of memory cells over the memory region of the strip;
    depositing a doped insulating material over a portion of the strip between the first contact landing region and the memory region; and
    causing diffusion of dopant from the doped insulating material into the strip in said portion of the strip.

2. The method of claim 1, the memory device including a conductor in contact with the strip at an end side of the strip opposite the first contact landing region, and an end region between said conductor and the memory region of the strip, the method including depositing the doped insulating material over the end region.

3. The method of claim 1, the strip having a second contact landing region at an end side opposite the first contact landing region, and an end region between said second contact landing region and the memory region of the strip, the method including depositing the doped insulating material over the end region.

4. The method of claim 1, wherein respective gates of said memory cells block diffusion of the dopant from the doped insulating material into respective portions of the memory region of the strip.

5. The method of claim 1, including depositing said doped insulating material over the first contact landing region of the strip, and causing diffusion of the dopant from the doped insulating material into the first contact landing region.

6. The method of claim 1, the strip having a second contact landing region at an end side opposite the first contact landing region, the method including depositing said doped insulating material over the second contact landing region of the strip, and causing diffusion of the dopant from the doped insulating material into the second contact landing region.

7. The method of claim 1, the strip having a second contact landing region at an end side opposite the first contact landing region, a second switch region between the memory region and the second contact landing region, a ground select region between the switch region and the memory region, and a second ground select region between the second switch region and the memory region.

8. A method for manufacturing a memory device, comprising:
    forming a plurality of stacks of strips of semiconductor material, the strips having a memory region, a first contact landing region and a switch region between the memory region and the first contact landing region;
    forming a plurality of holes through layers of the semiconductor material in the switch region, each hole in the plurality of holes formed through the layers of the semiconductor material in the switch region;
    forming a memory layer on respective surfaces of the strips in the plurality of stacks in the memory region, on respective surfaces of holes in the plurality of holes in the switch region, and not on any surfaces of the strips between the first contact landing region and the switch region;
    forming a plurality of memory cells over the memory region of the strips;
    depositing a doped insulating material over respective portions of the strips between the first contact landing region and the memory region; and
    causing diffusion of dopant from the doped insulating material into the strips in said respective portions of the strips.

9. The method of claim 8, the memory device including conductors in contact with the strips at respective end sides of the strips opposite the first contact landing region, and respective end regions between the conductors and the memory region of the strips, the method including depositing the doped insulating material over the respective end regions.

10. The method of claim 8, the strips having a second contact landing region at respective end sides opposite the first contact landing region, and respective end regions between the second contact landing region and the memory region of the strips, the method including depositing the doped insulating material over the respective end regions.

11. The method of claim 8, wherein respective gates of said memory cells block diffusion of the dopant from the doped insulating material into respective portions of the memory region of the strips.

12. The method of claim 8, including depositing said doped insulating material over the first contact landing region of the strips, and causing diffusion of the dopant from the doped insulating material into the first contact landing region.

13. The method of claim 8, the strips having a second contact landing region at respective end sides opposite the first contact landing region, the method including depositing said doped insulating material over the second contact landing region of the strips, and causing diffusion of the dopant from the doped insulating material into the second contact landing region.

14. The method of claim 8, the strips having a second contact landing region at respective end sides opposite the first contact landing region, a second switch region between the memory region and the second contact landing region, a ground select region between the switch region and the memory region, and a second ground select region between the second switch region and the memory region.

15. The method of claim 8, wherein the memory device includes a source pad region terminating ends of the strips opposite the first contact landing region, including depositing said doped insulating material over the source pad region, and causing diffusion of dopant from said doped insulating material into the source pad region.

16. The method of claim 1, wherein said forming the plurality of memory cells includes forming a pattern of word lines in the memory region.

17. The method of claim 1, including:
    depositing a conductive material in the hole to form a string select gate in the hole in the switch region before said depositing the doped insulating material, such that the string select gate is laterally surrounded on all sides by the memory layer formed on the surfaces of the hole.

18. The method of claim 8, wherein said forming the plurality of memory cells includes forming a pattern of word lines in the memory region.

19. The method of claim 8, including:
    depositing a conductive material in the holes to form respective string select gates in the holes in the switch region before said depositing the doped insulating material, such that the respective string select gates are laterally surrounded on all sides by the memory layer formed on the respective surfaces of the holes.

* * * * *